US007759049B2

(12) United States Patent
Yamada et al.

(10) Patent No.: US 7,759,049 B2
(45) **Date of Patent: *Jul. 20, 2010**

(54) PHOTOSENSITIVE RESIN COMPOSITION FOR ORIGINAL PRINTING PLATE CAPABLE OF BEING CARVED BY LASER

(75) Inventors: Hiroshi Yamada, Mishima (JP); Masahisa Yokota, Hachiouji (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 603 days.

This patent is subject to a terminal disclaimer.

(21) Appl. No.: 10/514,411

(22) PCT Filed: Jun. 25, 2003

(86) PCT No.: PCT/JP03/08027

§ 371 (c)(1), (2), (4) Date: Nov. 15, 2004

(87) PCT Pub. No.: WO04/000571

PCT Pub. Date: Dec. 31, 2003

(65) Prior Publication Data

US 2005/0227165 A1 Oct. 13, 2005

(30) Foreign Application Priority Data

Jun. 25, 2002 (JP) ............................ 2002-184808
Mar. 3, 2003 (JP) ............................ 2003-055935

(51) Int. Cl.
*G03C 1/00* (2006.01)
*G03F 7/00* (2006.01)
*G03F 7/26* (2006.01)

(52) U.S. Cl. .................. 430/306; 430/281.1; 430/286.1

(58) Field of Classification Search .............. 430/270.1, 430/281.1, 306, 945, 285.1, 307, 286.1; 106/816
See application file for complete search history.

(56) References Cited

U.S. PATENT DOCUMENTS 3,549,733 A 12/1970 Caddell
5,798,202 A 8/1998 Cushner et al.
5,804,353 A 9/1998 Cushner et al.
5,851,649 A * 12/1998 Mohri et al. ............. 428/319.1
5,916,732 A * 6/1999 Sasashita et al. ......... 430/287.1
6,372,351 B1 * 4/2002 Takemiya et al. ........... 428/416
6,387,594 B1 * 5/2002 Kakishita et al. ............ 430/300
6,399,270 B1 * 6/2002 Mori et al. ............... 430/270.1
6,410,123 B1 * 6/2002 Otani et al. .............. 428/32.18
6,569,816 B2 * 5/2003 Oohira et al. ............... 508/107
2001/0044076 A1 * 11/2001 Hiller et al. ................. 430/306
2002/0045126 A1 * 4/2002 Watanabe et al. ........ 430/280.1
2004/0157162 A1 * 8/2004 Yokota et al. ............... 430/306

FOREIGN PATENT DOCUMENTS

EP 1215044 A2 * 6/2002
JP 2846954 10/1998
JP 2846955 10/1998
JP 10-512823 12/1998
JP 11-338139 12/1999
JP 2000-155418 6/2000
JP 2001-121833 5/2001
JP 2001-328365 11/2001
JP 2002-3665 1/2002
JP 2002-244289 8/2002

OTHER PUBLICATIONS www.agc.co.jp/english/chemicals/shinsei/gel/sun-gel.html., Asahi Glass Company, 1996.*
www.agc.co.jp/english/chemicals/shinsei/gel/sun-gel.html (Oct. 9, 1999).*
Internet Archive, Wayback Machine results for www.agc.co.jp/english/chemicals/shinsei/gel/sun-gel.html.*
www.fuji-silysia.co.jp/english/product/micronized_silica/sylosphere.html (2003).*

* cited by examiner

*Primary Examiner*—Cynthia H Kelly
*Assistant Examiner*—Connie P Johnson
(74) *Attorney, Agent, or Firm*—Staas & Halsey LLP

(57) ABSTRACT

A photosensitive resin composition for forming a laser engravable printing element, comprising: (a) 100 parts by weight of a resin which is in a solid state at 20° C., wherein the resin has a number average molecular weight of from 5,000 to 300,000, (b) 5 to 200 parts by weight of an organic compound having a number average molecular weight of less than 5,000 and having at least one polymerizable unsaturated group per molecule, and (c) 1 to 100 parts by weight of an inorganic porous material having an average pore diameter of from 1 to 1,000 nm, a pore volume of from 0.1 to 10 ml/g and a number average particle diameter of not more than 10 μm. A laser engravable printing element formed from the above-mentioned resin composition. A method for producing a laser engraved printing element by using the above-mentioned photosensitive resin composition.

14 Claims, No Drawings

PHOTOSENSITIVE RESIN COMPOSITION FOR ORIGINAL PRINTING PLATE CAPABLE OF BEING CARVED BY LASER

BACKGROUND OF THE INVENTION

1. Field of the Invention

The present invention relates to a photosensitive resin composition for forming a laser engravable printing element. More particularly, the present invention is concerned with a photosensitive resin composition for forming a laser engravable printing element, comprising: (a) a resin which is in a solid state at 20° C., wherein the resin has a number average molecular weight of from 5,000 to 300,000, (b) an organic compound having a number average molecular weight of less than 5,000 and having at least one polymerizable unsaturated group per molecule, and (c) an inorganic porous material having an average pore diameter of from 1 nm to 1,000 nm, a pore volume of from 0.1 ml/g to 10 ml/g and a number average particle diameter of not more than 10 μm. Further, the present invention is also concerned with a laser engravable printing element formed from the photosensitive resin composition of the present invention. By the use of the photosensitive resin composition of the present invention, it becomes possible to obtain a printing element which can suppress the generation of debris during the laser engraving thereof, thereby rendering easy the removal of debris. Further, the obtained printing element is advantageous in that a precise image can be formed on the printing element by laser engraving, and in that the resultant image-bearing printing plate not only has small surface tack and excellent abrasion resistance, but also is capable of suppressing the adherence of paper dust and the like to the printing element and the occurrence of printing defects. Further, the present invention is also concerned with a method for producing a laser engravable printing element using the photosensitive resin composition of the present invention.

2. Prior Art

The flexographic printing method is used in the production of packaging materials (such as a cardboard, a paperware, a paper bag and a flexible packaging film) and materials for construction and furnishing (such as a wall paper and an ornamental board) and also used for printing labels. Such flexographic printing method has been increasing its importance among other printing methods. A photosensitive resin is generally employed for producing a flexographic printing plate, and the production of a flexographic printing plate using a photosensitive resin has conventionally been performed by the following method. A photo-mask bearing a pattern is placed on a liquid resin or a solid resin sheet (obtained by molding a resin into a sheet), and the resultant masked resin is imagewise exposed to light, to thereby crosslink the exposed portions of the resin, followed by developing treatment in which the unexposed portions of the resin (i.e., uncrosslinked resin portions) are washed away with a developing liquid. Recently, the so-called “flexo CTP (Computer to Plate) method” has been developed. In this method, a thin, light absorption layer called “black layer” is formed on the surface of a photosensitive resin plate, and the resultant resin plate is irradiated with a laser to ablate (evaporate) desired portions of the black layer to form a mask bearing an image (formed by the unablated portions of the black layer) on the resin plate directly without separately preparing a mask. Subsequently, the resultant resin plate is imagewise exposed to light through the mask, to thereby crosslink the exposed portions of the resin, followed by developing treatment in which the unexposed portions of the resin (i.e., uncrosslinked resin portions) are washed away with a developing liquid. Since the efficiency in producing the printing plates has been improved by this method, its use is beginning to expand in a wide variety of fields. However, this method also requires a developing treatment as in the case of other methods and, hence, the improvement in the efficiency in producing the printing plates is limited. Therefore, it has been desired to develop a method for forming a relief pattern directly on a printing element by using a laser without a need for a developing treatment.

As an example of a method for producing a printing plate by directly forming a relief pattern on a printing element using a laser, which method does not require a developing treatment, there can be mentioned a method in which a printing element is engraved directly with a laser. Such a method has already been used for producing relief plates and stamps, in which various materials are used for forming the printing elements.

For example, U.S. Pat. No. 3,549,733 discloses the use of a polyoxymethylene or polychloral for forming a printing element. Further, Japanese Patent Application prior-to-examination Publication (Tokuhyo) No. Hei 10-512823 (corresponding to DE 19625749 A) describes the use of a silicone polymer or a silicone fluoropolymer for forming a printing element. In each of the specific examples of compositions used for forming the printing element, which are described in this patent document, fillers, such as amorphous silica, are added to the above-mentioned polymer. However, a photosensitive resin is not used in the inventions disclosed in the above-mentioned patent documents. In the above-mentioned Japanese Patent Application prior-to-examination Publication (Tokuhyo) No. Hei 10-512823, amorphous silica is added to the polymer for improving the mechanical properties of the polymer and reducing the amount of an expensive elastomer used in the printing element. Further, this patent document has no description about the properties of the amorphous silica used.

Unexamined Japanese Patent Application Laid-Open Specification No. 2001-121833 (corresponding to EP 1080883 A) describes the use of a mixture of a silicone rubber and carbon black for producing a printing element, wherein the carbon black is used as a laser beam absorber. However, a photosensitive resin is not used in this invention.

Unexamined Japanese Patent Application Laid-Open Specification No. 2001-328365 discloses the use of a graft-copolymer as a material for producing a printing element. Further, this patent document describes that, for improving the mechanical properties of the graft copolymer, a non-porous silica having a particle diameter which is smaller than the wavelength of the visible light may be mixed with the graft copolymer. However, this patent document has no description about the removal of a liquid debris which is generated by laser engraving.

Unexamined Japanese Patent Application Laid-Open Specification No. 2002-3665 uses an elastomer composed mainly of ethylene monomer units, and this patent document describes that silica may be added to the elastomer as a reinforcing agent. In the Working Examples of this patent document, 50 parts by weight of a porous silica and 50 parts by weight of calcium carbonate were added to 100 parts by weight of a resin. Both of the above-mentioned porous silica and calcium carbonate were used only as white reinforcing agents and, for achieving a satisfactory reinforcing effect, those reinforcing agents were used in large amounts (total amount of the reinforcing agents was as large as 100 parts by weight). That is, the use of a silica in this patent document does not extend beyond the customary technology in which a silica is used as a reinforcing agent for a rubber. Further, the resin used in this patent document is not a photosensitive resin and the resin is cured by heating. Therefore, the curing rate of the resin is low and the dimensional precision of a sheet obtained from the resin is poor.

Each of Japanese Patent No. 2846954 (corresponding to U.S. Pat. No. 5,798,202) and Japanese Patent No. 2846955 (corresponding to U.S. Pat. No. 5,804,353) discloses the use of a reinforced elastomer material obtained by mechanically, photochemically and thermochemically reinforcing a thermoplastic elastomer, such as SBS (polystyrene-polybutadiene-polystyrene), SIS (polystyrene-polyisoprene-polystyrene) and SEBS (polystyrene-polyethylene/polybutadiene-polystyrene). When a printing element formed from a thermoplastic elastomer is engraved with a laser beam having an oscillation wavelength within the infrared region, even portions of the printing element which are distant from the portion irradiated with the laser beam also tend to melt by heat. Therefore, the resultant printing element cannot be used for preparing an engraved pattern having a high resolution. For removing this problem, it is necessary to add a filler to the thermoplastic elastomer to thereby improve the mechanical properties thereof. In each of the above-mentioned patent documents, for improving the mechanical properties of the thermoplastic elastomer and increasing the absorption of the laser beam by the thermoplastic elastomer, carbon black having excellent ability to enhance the mechanical properties of a resin is added to a thermoplastic elastomer. However, since carbon black is added to the elastomer, light transmittance of the elastomer is lowered, which is disadvantageous when it is attempted to crosslink the elastomer by irradiation (i.e., when it is attempted to perform a photochemical reinforcement of the elastomer). Therefore, when the above-mentioned reinforced elastomer material is subjected to laser engraving, it results in the generation of a large amount of debris (including viscous liquid material) which is difficult to remove. The generation of such debris not only necessitates a time-consuming treatment for removing the debris, but also causes problems, such as an imprecise boundary between elastomer portions which have been melted by laser beam irradiation and unmolten elastomer portions which form the relief pattern, the swelling of the edges of the unmolten elastomer portions forming the relief pattern, the adherence of the molten elastomer to the surfaces and/or sides of the unmolten elastomer portions forming the relief pattern, and the destruction of portions of the relief pattern which correspond to the dots of a print obtained using the relief pattern.

Further, when a large amount of liquid debris, which is presumed to be a laser decomposition product of the resin, is generated during the laser engraving of the printing element, the liquid debris stains the optical parts of a laser engraving apparatus. When the liquid debris is adhered to the surface of optical parts, such as a lens and a mirror, the resin causes serious troubles of the apparatus, such as burnout of the apparatus.

In the above-mentioned reinforced elastomer materials disclosed in Japanese Patent Nos. 2846954 and 2846955, a filler, such as carbon black, inhibits the reinforced elastomer materials from being completely photocured. Therefore, when the reinforced elastomer materials are used for forming a printing element, the formed printing element suffers problems, such as unsatisfactory engraving depth and generation of viscous debris. For solving these problems, Unexamined Japanese Patent Application Laid-Open Specification No. 2002-244289 discloses the use of a thermoplastic elastomer composition obtained by adding to a thermoplastic elastomer a bleachable compound as a photopolymerization initiator and further adding an additive having a functional group (e.g., an Si—O group) which absorbs infrared radiation, to thereby produce a printing element having improved engraving sensitivity (i.e., index defined as an engraving depth per unit time). A bleachable photopolymerization initiator (such as triphenylphosphine oxide) generates radical species while being decomposed by absorbing light. Simultaneously with the decomposition of the bleachable photopolymerization initiator, the bleachable photopolymerization initiator loses its capacity to absorb radiation. Therefore, when a printing element is produced using a photosensitive resin composition containing a bleachable photopolymerization initiator, the light transmittance into the inner portion of the photosensitive resin composition is improved and the photosensitive resin composition can be cured satisfactorily, thereby suppressing the generation of liquid debris. In the Working Examples of the above-mentioned patent document, an additive, such as zirconium silicate ($ZrSiO_4$) or amorphous silica, is used, but there is no description about the properties of the additive used. As a most preferred example of a photosensitive resin composition having excellent engraving sensitivity and high engraving debris cleanability (i.e., efficiency in removing debris generated during the laser engraving), there is mentioned a resin composition containing a bleachable photopolymerization initiator and zirconium silicate in combination. In a working example of the above-mentioned patent document which uses an amorphous silica instead of zirconium silicate, it is described that debris generated during the laser engraving was slightly tacky and the cleaning of debris was not so difficult. Further, a combination of 2,2-dimethoxy-2-phenylacetophenone (which is generally used as a photopolymerization initiator for a photosensitive resin composition) and zirconium silicate is described in a Comparative Example of the above-mentioned patent document.

The above-mentioned Unexamined Japanese Patent Application Laid-Open Specification No. 2002-244289 contains no detailed description about the type and properties of the zirconium silicate used. Zirconium silicate is a crystalline inorganic compound having a high melting point, and it is very difficult to produce porous microparticles of amorphous zirconium silicate by any of the melt method, the wet method, the sol-gel method and the like, while maintaining the composition of zirconium silicate (theoretical chemical composition of this compound $ZrSiO_4$: 64.0% of $ZrO_2$ and 34.0% of $SiO_2$). Therefore, microparticles of zirconium silicate are obtained by pulverizing a bulk of crystals, and it is presumed that the particles obtained in such a manner are not porous. In "Kagaku Dai Jiten (Encyclopedia Chimica)" published by KYORITSU SHUPPAN CO., LTD., Japan, it is described that zirconium silicate, which is a mineral silicate of zirconium, is the main component of a mineral known as zircon, and that, in many cases, zirconium silicate is in the form of short prismatic crystals having chemical and physical properties which are greatly different from those of zirconium oxide. The above-mentioned document describes that the term "mineral" used therein means a homogeneous inorganic substance which is a component of the earth's crust and has a crystal structure in which atoms and ions are regularly arranged. In addition, in "13901 no Kagaku Shohin (13901 Chemical Products)" published by The Chemical Daily Co., Ltd, Japan, it is also described that pulverized zirconium sand is called "zirconium silicate" in an open market. The present inventors analyzed a commercially available zirconium silicate (Product No. 261-00515 (catalogue issued in 2002); manufactured and sold by Wako Pure Chemical Industries, Ltd., Japan). Specifically, the observation of the zirconium silicate particles under a scanning electron microscope revealed that the particles have no definite shape. Further, the pore volume of the zirconium silicate particles measured by the nitrogen adsorption method was as small as 0.026 ml/g. Thus, the present inventors found that the above-mentioned commercially available zirconium silicate was not porous. In addition, another commercially available zirconium silicate (Product No. 38328-7; manufactured and sold by Sigma-Aldrich Co., U.S.A.) was also analyzed in the above-mentioned manner, and it was confirmed that this zirconium silicate was also not porous.

Furthermore, in the above-mentioned Unexamined Japanese Patent Application Laid-Open Specification No. 2002-244289, there is no description about the relationship between the engraving debris cleanability and the properties of the particles used as an additive. In addition, there is no description about the preferred shape of the particles used as the additive. Therefore, it is apparent that the invention disclosed in this patent document is based on a technical concept that the generation of liquid debris is lowered by improving the light transmittance into the inner portion of the photosensitive resin composition to thereby satisfactorily cure the photosensitive resin composition. Thus, although the debris cleaning effect is reported in this patent document, this effect has no relation to the ability of an inorganic porous material to remove a liquid debris.

SUMMARY OF THE INVENTION

In this situation, the present inventors have made extensive and intensive studies with a view toward developing a photosensitive resin composition which is suitable as a material for forming a printing element used for producing an image-bearing printing plate, wherein the image-bearing printing plate is produced by removing a part of the printing element by laser beam irradiation. As a result, it has surprisingly been found that, when a printing element is formed from a specific resin composition which comprises a photosensitive resin (which is easily decomposed by laser beam irradiation) and an inorganic porous material (which is used for absorption removal of viscous liquid debris generated in a large amount due to the use of the easily decomposable resin), the formed printing element generates only a small amount of debris during the laser engraving of the printing element. Further, the produced printing element is advantageous in that a precise image can be formed on the printing element by laser engraving, and in that the resultant image-bearing printing plate not only has small surface tack and excellent abrasion resistance, but also is capable of suppressing the adherence of paper dust and the like to the printing element, and the occurrence of printing defects. In addition, the present inventors have found that the use of a specific inorganic porous material in combination with a resin which is in a solid state at 20° C. (and which is advantageous for obtaining a cured resin product having a high rigidity) for forming a photosensitive resin composition is advantageous in that an image-bearing printing plate formed using such a photosensitive resin composition is free from the lowering of abrasion resistance during the printing and the occurrence of printing defects. The present invention has been completed, based on these novel findings.

Accordingly, it is an object of the present invention to provide a photosensitive resin composition which is especially advantageous for use in the production of a relief printing plate, which production is conventionally accompanied by a generation of a large amount of engraving debris.

It is another object of the present invention to provide a laser engravable printing element formed from the above-mentioned photosensitive resin composition.

It is still another object of the present invention to provide a method for producing a laser engravable printing element by using the above-mentioned photosensitive resin composition.

The foregoing and other objects, features and advantages of the present invention will be apparent from the following detailed description taken in connection with the appended claims.

DETAILED DESCRIPTION OF THE INVENTION

In one aspect of the present invention, there is provided a photosensitive resin composition for forming a laser engravable printing element, comprising:

(a) 100 parts by weight of a resin which is in a solid state at 20° C., wherein the resin has a number average molecular weight of from 5,000 to 300,000, (b) 5 to 200 parts by weight, relative to 100 parts by weight of the resin (a), of an organic compound having a number average molecular weight of less than 5,000 and having at least one polymerizable unsaturated group per molecule, and (c) 1 to 100 parts by weight, relative to 100 parts by weight of the resin (a), of an inorganic porous material having an average pore diameter of from 1 nm to 1,000 nm, a pore volume of from 0.1 ml/g to 10 ml/g and a number average particle diameter of not more than 10 μm.

For easy understanding of the present invention, the essential features and various embodiments of the present invention are enumerated below.

1. A photosensitive resin composition for forming a laser engravable printing element, comprising:

(a) 100 parts by weight of a resin which is in a solid state at 20° C., wherein the resin has a number average molecular weight of from 5,000 to 300,000, (b) 5 to 200 parts by weight, relative to 100 parts by weight of the resin (a), of an organic compound having a number average molecular weight of less than 5,000 and having at least one polymerizable unsaturated group per molecule, and (c) 1 to 100 parts by weight, relative to 100 parts by weight of the resin (a), of an inorganic porous material having an average pore diameter of from 1 nm to 1,000 nm, a pore volume of from 0.1 ml/g to 10 ml/g and a number average particle diameter of not more than 10 μm.

2. The photosensitive resin composition according to item 1 above, wherein the inorganic porous material (c) has a specific surface area of from 10 $m^2/g$ to 1,500 $m^2/g$ and an oil absorption value of from 10 ml/100 g to 2,000 ml/100 g.

3. The photosensitive resin composition according to item 1 or 2 above, wherein at least 30% by weight of the resin (a) is at least one resin selected from the group consisting of a thermoplastic resin having a softening temperature of 500° C. or less and a solvent-soluble resin.

4. The photosensitive resin composition according to any one of items 1 to 3 above, wherein at least 20% by weight of the organic compound (b) is a compound having at least one functional group selected from the group consisting of an alicyclic functional group and an aromatic functional group.

5. The photosensitive resin composition according to any one of items 1 to 4 above, wherein the inorganic porous material (c) is a spherical particle or a regular polyhedral particle.

6. The photosensitive resin composition according to item 5 above, wherein at least 70% of the inorganic porous material (c) is a spherical particle having a sphericity of from 0.5 to 1.

7. The photosensitive resin composition according to item 5 above, wherein the inorganic porous material (c) is a regular polyhedral particle having a $D_3/D_4$ value of from 1 to 3, wherein $D_3$ represents the diameter of a smallest sphere which encloses the regular polyhedral particle therein and $D_4$ represents the diameter of a largest sphere which is enclosed in the regular polyhedral particle.

8. The photosensitive resin composition according to any one of items 1 to 7 above, which is for use in forming a relief printing element.

9. A laser engravable printing element produced by a process comprising:

shaping the photosensitive resin composition of any one of items 1 to 7 above into a sheet or cylinder, and crosslink-curing the photosensitive resin composition by light or electron beam irradiation.

10. A multi-layered, laser engravable printing element comprising a printing element layer and at least one elastomer layer provided below the printing element layer, wherein the printing element layer is made of the laser engravable printing element of item 9 above and the elastomer layer has a Shore A hardness of from 20 to 70.

11. The multi-layered, laser engravable printing element according to item 10 above, wherein the elastomer layer is formed by photocuring a resin which is in a liquid state at 20° C.

12. A method for producing a laser engraved printing element, which comprises:

(i) forming a photosensitive resin composition layer on a support, wherein the photosensitive resin composition layer is obtained by shaping the photosensitive resin composition of any one of items 1 to 7 above into a sheet or cylinder, (ii) crosslink-curing the photosensitive resin composition layer by light or electron bean irradiation, thereby obtaining a cured resin composition layer, and (iii) irradiating a portion of the cured resin composition layer which is preselected in accordance with a desired relief pattern, with a laser beam to ablate and remove the irradiated portion of the cured resin composition layer, thereby forming a relief pattern on the cured resin composition layer.

13. The method according to item 12 above, wherein the irradiation of the portion of the cured resin composition layer with a laser beam is performed while heating the portion.

Hereinbelow, the present invention is explained in more detail.

The photosensitive resin composition of the present invention comprises (a) 100 parts by weight of a resin which is in a solid state at 20° C., wherein the resin has a number average molecular weight of from 5,000 to 300,000; (b) 5 to 200 parts by weight, relative to 100 parts by weight of the resin (a), of an organic compound having a number average molecular weight of less than 5,000 and having at least one polymerizable unsaturated group per molecule; and (c) 1 to 100 parts by weight, relative to 100 parts by weight of the resin (a), of an inorganic porous material having an average pore diameter of from 1 nm to 1,000 nm, a pore volume of from 0.1 ml/g to 10 ml/g and a number average particle diameter of not more than 10 μm. In the present invention, the term "laser engravable printing element" means a cured resin material which is used as a base material of a printing plate, namely a cured resin material on which a desired image will be formed by laser engraving.

Resin (a) used in the present invention is a resin which is in a solid state at 20° C. In the present invention, by the use of such a solid resin as resin (a), the photosensitive resin composition exhibits, in a photocured form thereof, a very high rigidity. Therefore, the photosensitive resin composition of the present invention is especially suitable in a field where a high rigidity of a resin is required, e.g., in a field where a printing plate is used for embossing.

The number average molecular weight of resin (a) is in the range of from 5,000 to 300,000, preferably from 7,000 to 200,000, more preferably from 10,000 to 100,000. When a resin composition is produced using resin (a) having a number average molecular weight of less than 5,000, the mechanical strength of the printing element produced from such a resin composition becomes unsatisfactory. On the other hand, when a resin composition is produced using resin (a) having a number average molecular weight of more than 300,000, it becomes difficult to remove satisfactorily the debris formed by laser beam irradiation, namely a molten or decomposed resin, and it becomes especially difficult to remove engraving debris adhered to the edge portions of a relief pattern. The number average molecular weight of resin (a) is determined by GPC (gel permeation chromatography) in which a calibration curve prepared using standard polystyrene samples is employed.

Both an elastomeric resin and a non-elastomeric resin can be used as resin (a) as long as the resin satisfies the above-mentioned requirements. As resin (a), use can be made of a thermoplastic resin and a compound, such as a polyimide resin, which has no or very low thermoplasticity (that is, a compound having a very high melting temperature).

The technical characteristic of the present invention resides in the use of an inorganic porous material for the absorption removal of the liquid debris formed by laser beam irradiation. Therefore, it is preferred that resin (a) used in the present invention is a resin which is easily liquefied or decomposed by laser beam irradiation. As an example of a resin which is easily liquefied by laser beam irradiation, there can be mentioned a thermoplastic resin having a low softening temperature. Examples of such thermoplastic resins include thermoplastic elastomers, such as SBS (polystyrene-polybutadiene-polystyrene), SIS (polystyrene-polyisoprene-polystyrene), SBR (styrene-butadiene rubber); and other resins, such as polysulfone, polyether sulfone and polyethylene. Preferred examples of resins which are easily decomposed by laser beam irradiation include resins containing in the molecular chain thereof easily decomposable monomer units, such as monomer units derived from styrene, α-methylstyrene, acrylates, methacrylates, ester compounds, ether compounds, nitro compounds and alicyclic compounds. As representative examples of such easily decomposable resins, there can be mentioned polyethers, such as polyethylene glycol, polypropylene glycol and polytetraethylene glycol; aliphatic polycarbonates; and other resins, such as poly(methyl methacrylate), polystyrene, nitrocelluose, polyoxyethylene, polynorbornene, hydrated polycyclohexadiene and resins (such as a dendrimer) having many branched structures. As an index for evaluating the decomposability of a resin, there can be mentioned a weight loss which is measured under air by thermogravimetric analysis. The weight loss of resin (a) used in the present invention is preferably 50% by weight or more at 500° C. When the weight loss of a resin is 50% by weight or more at 500° C., such a resin can be satisfactorily decomposed by laser beam irradiation.

There is no particular limitation with respect to the thermoplastic elastomers used as resin (a) in the present invention. As such thermoplastic elastomers, there can be mentioned styrene thermoplastic elastomers, such as SBS (polystyrene-polybutadiene-polystyrene), SIS (polystyrene-polyisoprenepolystyrene) and SEBS (polystyrene-polyethylene/polybutylene-polystyrene); olefin thermoplastic elastomers; urethane thermoplastic elastomers; ester thermoplastic elastomers; amide thermoplastic elastomers; and silicone thermoplastic elastomers. Alternatively, for improving the heat decomposability of resin (a), use can be made of a polymer which is obtained by introducing a readily decomposable functional group, such as a carbamoyl group or a carbonate group, into the molecular skeleton of the polymer. A thermoplastic elastomer can be fluidized by heating and, thus, the fluidized thermoplastic elastomer can be easily mixed with inorganic porous material (c) used in the present invention. In the present invention, the term “thermoplastic elastomer” means a polymer which has the ability to easily flow by heating and be easily processed into various shapes as in the case of other thermoplastic resins, and which shows rubber elasticity at room temperature. A thermoplastic elastomer contains a soft segment and a hard segment in the molecular structure thereof. The soft segment is formed by a polyether, a rubbery polymer or the like, and the hard segment is formed by a material which does not undergo plastic deformation at around room temperature as in the case of a vulcanized rubber. There are various types of hard segments, such as a frozen hard segment, a crystalline hard segment, a hydrogen bond hard segment and an ionically crosslinked hard segment.

A suitable type of thermoplastic elastomer may be selected depending on the use of the ultimate printing plate. For example, when it is intended to use the printing plate produced using the photosensitive resin composition of the present invention in the field where the printing plate is required to exhibit a solvent resistance, it is preferred that the thermoplastic elastomer used for producing the photosensitive resin composition is a thermoplastic urethane elastomer, a thermoplastic ester elastomer, a thermoplastic amide elastomer or a thermoplastic fluoro elastomer, and when it is intended to use the printing plate in the field where the printing plate is required to have a heat resistance, it is preferred that the thermoplastic elastomer used for producing the photosensitive resin composition is a thermoplastic urethane elastomer, a thermoplastic olefin elastomer, a thermoplastic ester elastomer or a thermoplastic fluoro elastomer. Further, the strength of a cured form of the photosensitive resin composition can be varied greatly by changing the type of the thermoplastic elastomer used. When it is intended to use the photosensitive resin composition for producing a general purpose printing plate, it is preferred that resin (a) has a Shore A hardness in the range of from 20 to 75. On the other hand, when it is intended to use the photosensitive resin composition for producing a printing plate used for embossing (that is, for forming concavo-convex pattern on the surface of a paper, a film, a construction material or the like), a cured form of the resin composition is required to have relatively high hardness and, hence, it is preferred that resin (a) has a Shore D hardness in the range of from 30 to 80.

There is no particular limitation with respect to the non-elastomeric thermoplastic resin used in the present invention. For example, there can be mentioned a polyester resin, an unsaturated polyester resin, a polyamide resin, a polyamide-imide resin, a polyurethane resin, an unsaturated polyurethane resin, a polysulfone resin, a polyethersulfone resin, a polyimide resin, a polycarbonate resin and a wholly aromatic polyester resin.

It is preferred that at least 30% by weight, more advantageously at least 50% by weight, still more advantageously at least 70% by weight of resin (a) used in the present invention is at least one resin selected from the group consisting of a thermoplastic resin and a solvent-soluble resin, each independently having a softening temperature of 500° C. or less. In the present invention, the thermoplastic resin and the solvent-soluble resin can be used either individually or in combination. In resin (a) used in the present invention, the amount of the thermoplastic resin (having a softening temperature of 500° C. or less) and/or solvent-soluble resin is up to 100% by weight.

The softening temperature of the thermoplastic resin is preferably in the range of from 50° C. to 500° C., more preferably from 80° C. to 350° C., most preferably from 100° C. to 250° C. When a photosensitive resin composition is produced using a thermoplastic resin having a softening temperature of 50° C. or more, such a photosensitive resin composition is in a solid state at room temperature and, thus, a shaped article obtained by shaping the photosensitive resin composition into a sheet or cylinder can be handled without suffering distortion of the shaped article. On the other hand, when a photosensitive resin composition is produced using a thermoplastic resin having a softening temperature of 500° C. or less, such a photosensitive resin composition can be shaped into a sheet or cylinder without employing a very high temperature and, therefore, there is no danger of denaturation or decomposition of other compounds contained in the photosensitive resin composition. In the present invention, the softening temperature of resin (a) is a value determined by a dynamic viscoelastometer, and the softening temperature is defined as a temperature at which the viscosity of a resin changes drastically (in other words, a temperature at which the slope of the viscosity curve changes) when the temperature of the resin is elevated gradually from room temperature.

A thermoplastic resin having a softening temperature of 500° C. or less may be an elastomer or a non-elastomeric resin, and use can be made of the thermoplastic resins which are exemplified above.

When resin (a) contains a thermoplastic resin having a softening temperature of 500° C. or less, a cured form of the photosensitive resin composition obtained using such resin (a) is satisfactorily fluidized when it is subjected to laser beam irradiation and, therefore, the resultant fluidized resin composition is efficiently absorbed by inorganic porous material (c) contained in the resin composition. The photosensitive resin composition of the present invention can be shaped by extrusion molding or coating method. However, when the softening temperature of a thermoplastic resin used as resin (a) exceeds 350° C., it becomes difficult to conduct the extrusion molding of the photosensitive resin composition under typical conditions. Specifically, in such a case, the extrusion molding of the photosensitive resin composition must be performed at high temperatures. When the extrusion molding is performed at high temperatures, there is a danger of denaturation and decomposition of organic compounds other than resin (a) contained in the photosensitive resin composition and, thus, it is preferred that a thermoplastic resin having a softening temperature above 350° C. is soluble in a solvent. Even when a thermoplastic resin has a high softening temperature, such a thermoplastic resin can be dissolved in a solvent and shaped by coating method and the like as long as the thermoplastic resin has a solvent solubility.

A solvent-soluble resin used as resin (a) in the present invention is defined as a resin having a solubility wherein 10 to 1,000 parts by weight of the resin gets dissolved in 100 parts by weight of a solvent at 20° C. With respect to the solvent-soluble resin used in the present invention, there is no particular limitation as long as the resin has a solubility in the above-mentioned range and, thus, the solvent-soluble resin also encompasses a resin (such as a polyimide resin) which has a softening temperature higher than 500° C. as long as the resin is soluble in a solvent. Specific examples of solvent-soluble resins include a polysulfone resin, a polyimide resin, a polyethersulfone resin, an epoxy resin, a bismaleimide resin, a novolac resin, an alkyd resin, a polyolefin resin and a polyester resin. A solvent-soluble resin can be liquefied by dissolving the resin in a solvent and, therefore, exhibits excellent processability.

With respect to the solvent used together with the solvent-soluble resin, there is no particular limitation as long as the solubility of the resin is in the above-mentioned range. It is preferred that the boiling temperature of the solvent is in the range of from 50° C. to 200° C., more preferably from 60° C. to 150° C. A plurality of different solvents having different boiling temperatures may be used in combination. Specific examples of solvents include ketones, such as methyl ethyl ketone; ethers, such as tetrahydrofuran; halogenated alkyls, such as chloroform; heteroaromatic compounds, such as n-methylpyrrolidone and pyridine; esters, such as ethyl acetate; long chain hydrocarbons, such as octane and nonane; aromatic compounds, such as toluene and xylene; and alcohols, such as ethanol and butanol. Solvents which are generally used in the art are summarized in "Youzai Handobukku (Solvent Handbook)" published by Kodansha Scientifics, Japan, and an appropriate solvent can be selected from those which are described in this document, based on the explanations provided in this document. There are infinite number of combinations of a resin and a solvent, but it is preferred that the combination of a solvent and a resin is selected using as an index the solubility parameter described in the above-mentioned "Youzai Handobukku (Solvent Handbook)".

The solvent-soluble resin is used in the form of a resin solution obtained by dissolving the solvent-soluble resin in a solvent. There is no particular limitation with respect to the amount of the solvent used, but it is preferred that the resin concentration of the resin solution is in the range of from 10 to 80% by weight, more preferably from 20 to 60% by weight. When too large an amount of solvent is used for preparing the resin solution, problems are likely to arise, such as generation of bubbles during the solvent removal performed after shaping of the photosensitive resin composition, and difficulty in removal of the solvent from the inner portion of the shaped photosensitive resin composition (i.e., printing element). On the other hand, when too small an amount of solvent is used for preparing the resin solution, problems are likely to arise, such as disadvantageously high viscosity of the resin solution, and non-uniform dissolution of the resin in the solvent.

The resin used as resin (a) in the present invention has a relatively large number average molecular weight and, therefore, it is not necessary for the resin to have a polymerizable unsaturated group in the molecular chain thereof. However, the resin used as resin (a) may have a highly reactive, polymerizable unsaturated group at a terminal(s) of a main chain thereof or in a side chain(s) thereof. In the present invention, the "polymerizable unsaturated group" means an unsaturated group which participates in a radical or addition polymerization reaction. Preferred examples of polymerizable unsaturated groups are mentioned below in connection with organic compound (b). In resin (a), the polymerizable unsaturated group may be bonded to the terminal of a main chain or side chain of resin (a), or to the non-terminal portion of the main chain or side chain of resin (a). When resin (a) having a highly reactive, polymerizable unsaturated group is used for producing a photosensitive resin composition, a printing element produced from such a photosensitive resin composition exhibits very high mechanical strength. However, when resin (a) has a polymerizable unsaturated group in an amount such that the average number of the polymerizable unsaturated group per molecule is more than 2, the photosensitive resin composition suffers a marked cure shrinkage at the time of photocuring. Therefore, it is preferred that the average number of the polymerizable unsaturated group per molecule of resin (a) is 2 or less. The introduction of a polymerizable unsaturated group into a resin molecule is relatively easy, especially in the case of a thermoplastic polyurethane elastomer or a thermoplastic polyester elastomer. The "introduction of a polymerizable unsaturated group into a resin molecule" means that an unsaturated group is bonded to the terminal of a main chain or side chain of a resin, or to the non-terminal portion of a main chain or side chain of a resin. With respect to the method for obtaining a resin having a polymerizable unsaturated group, for example, there can be mentioned a method in which a polymerizable unsaturated group is directly introduced into the terminal of a polymer. As another example of the method for obtaining such a resin, there can be mentioned the following method. A reactive polymer is produced by introducing a plurality of reactive groups (such as a hydroxyl group, an amino group, an epoxy group, a carboxyl group, an acid anhydride group, a ketone group, a hydrazine group, an isocyanate group, an isothiocyanate group, a cyclic carbonate group and an ester group) into a polymer as exemplified above, which has a molecular weight of several thousands. The produced reactive polymer is reacted with a binder compound having a plurality of binder groups capable of binding to the reactive groups of the polymer (for example, when the reactive groups of the polymer are hydroxyl groups or amino groups, a polyisocyanate can be used as the binder compound), to thereby adjust the molecular weight of the polymer and convert the terminals of the polymer into binder groups. Subsequently, an organic compound having a polymerizable unsaturated group as well as a group which is capable of reacting with the terminal binder groups of the reactive polymer is reacted with the reactive polymer to introduce the polymerizable unsaturated group into the terminals of the reactive polymer, thereby obtaining a resin having a polymerizable unsaturated group.

Organic compound (b) used for producing the photosensitive resin composition of the present invention is an organic compound having a number average molecular weight of less than 5,000 and having at least one polymerizable unsaturated group per molecule. From the viewpoint of ease in blending organic compound (b) with resin (a), the number average molecular weight of the organic compound (b) must be less than 5,000. With respect to the design of a photosensitive resin composition, in general, the combination of a compound having a relatively high molecular weight and a compound having a relatively low molecular weight is effective for producing a resin composition which exhibits excellent mechanical properties after cured. When a photosensitive resin composition is produced using only compounds having relatively low molecular weights, such a resin composition is disadvantageous not only in that the resin composition suffers a marked cure shrinkage at the time of photocuring, but also in that a long time is needed for curing the resin composition. On the other hand, when a photosensitive resin composition is produced using only compounds having relatively high molecular weights, it becomes difficult to cure such a resin composition and obtain a cured resin having excellent properties. Therefore, in the present invention, resin (a) having a high molecular weight and organic compound (b) having a low molecular weight are used in combination.

The number average molecular weight of the organic compound (b) is determined as follows. When the ratio of the weight average molecular weight Mw to the number average molecular weight Mn (i.e., the polydispersity Mw/Mn), which are determined by GPC, is 1.1 or more, the number average molecular weight is defined as the Mn value determined by GPC. When the polydispersity is 1.0 or more and less than 1.1 and only a single peak is observed in the gel permeation chromatogram, the molecular weight distribution of the organic compound (b) is very small. In such a case, the number average molecular weight is determined by GPC-MS (a method in which a mass spectroscopy is performed with respect to each component separated by gel permeation chromatography). When the polydispersity is less than 1.1 and a plurality of peaks are observed in the gel permeation chromatogram (i.e., when the organic compound (b) is a mixture of a plurality of different compounds (b) having different molecular weights), the weight ratio of the different compounds (b) is calculated from the area ratio of the peaks observed in the gel permeation chromatogram, and the number average molecular weight of the organic compound (b) is determined using the weight ratio of the different compounds (b).

The "polymerizable unsaturated group" of organic compound (b) means a polymerizable unsaturated group which participates in a radical polymerization reaction or an addition polymerization reaction. Preferred examples of polymerizable unsaturated groups which participate in a radical polymerization reaction include a vinyl group, an acetylene group, an acryl group, a methacryl group and an allyl group. Preferred examples of polymerizable unsaturated groups which participate in an addition polymerization reaction include a cinnamoyl group, a thiol group, an azido group, an epoxy group which participates in a ring-opening addition reaction, an oxetane group, a cyclic ester group, a dioxysilane group, a spiro-o-carbonate group, a spiro-o-ester group, a bicyclo-o-ester group, a cyclohexane group and a cyclic iminoether group. There is no particular limitation with respect to the number of polymerizable unsaturated groups of organic compound (b) so long as the organic compound (b) has at least one polymerizable unsaturated group per molecule. It is impossible to limit the maximum number of the polymerizable unsaturated group per molecule, but it is considered to be about 10. In the present invention, the number of the polymerizable unsaturated group per molecule of the organic compound (b) is a value determined by $^1$H-NMR.

Specific examples of organic compound (b) include olefins, such as ethylene, propylene, styrene and divinylbenzene; acetylene type compounds; (meth)acrylic acid and derivatives thereof; haloolefins; unsaturated nitriles, such as acrylonitrile; (meth)acrylamide and derivatives thereof; allyl compounds, such as allyl alcohol and allyl isocyanate; unsaturated dicarboxylic acids (such as maleic anhydride, maleic acid and fumaric acid) and derivatives thereof; vinyl acetate; N-vinylpyrrolidone; and N-vinylcarbazole. From the viewpoint of various advantages of products, such as availability, reasonable price and decomposability by laser beam irradiation, (meth)acrylic acid and derivatives thereof are preferred. The above-mentioned compounds (b) can be used individually or in combination depending on the use of the photosensitive resin composition.

Examples of derivatives of the compounds mentioned above as compound (b) include compounds having an alicyclic group, such as a cycloalkyl group, a bicycloalkyl group, a cycloalkene group or a bicycloalkene group; compounds having an aromatic group, such as a benzyl group, a phenyl group, a phenoxy group or a fluorenyl group; compounds having a group, such as an alkyl group, a halogenated alkyl group, an alkoxyalkyl group, a hydroxyalkyl group, an aminoalkyl group, a tetrahydrofurfuryl group, an allyl group or a glycidyl group; and esters with a polyol, such as an alkylene glycol, a polyoxyalkylene glycol, an (alkyl/allyl-oxy)polyalkylene glycol or trimethylol propane. Organic compound (b) may be a heterocyclic type aromatic compound containing nitrogen, sulfur or the like as a heteroatom. For example, since the printing element formed from the photosensitive resin composition of the present invention is used for producing a printing plate, for suppressing the swelling of the printing plate by a solvent used in a printing ink (i.e., an organic solvent, such as an alcohol or an ester), it is preferred that organic compound (b) is a compound having a long chain aliphatic group, an alicyclic group or an aromatic group.

Further, especially when it is intended to use the resin composition of the present invention in the field where the resin composition is required to have high rigidity, it is preferred that organic compound (b) is a compound having an epoxy group which participates in a ring-opening addition reaction. As compounds having an epoxy group which participates in a ring-opening addition reaction, there can be mentioned compounds which are obtained by reacting epichlorohydrin with any of various polyols (such as diols and triols); and epoxy compounds obtained by reacting a peracid with an ethylenic bond in an ethylenic bond-containing compound. Specific examples of such compounds include ethylene glycol diglycidyl ether, diethylene glycol diglycidyl ether, triethylene glycol diglycidyl ether, tetraethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerin diglycidyl ether, glycerin triglycidyl ether, trimethylol propane triglycidyl ether, bisphenol A diglycidyl ether, hydrogenated bisphenol A diglycidyl ether, diglycidyl ethers of a compound formed by addition-bonding ethylene oxide or propylene oxide to bisphenol A, polytetramethylene glycol diglycidyl ether, poly(propylene glycol adipate)diol diglycidyl ether, poly(ethylene glycol adipate)diol diglycidyl ether, poly(caprolactone)diol diglycidyl ether, 3,4-epoxycyclohexylmethyl 3',4'-epoxycyclohexylcarboxylate, 1-methyl-3,4-epoxycyclohexylmethyl 1'-methyl-3',4'-epoxycyclohexylcarboxylate, bis[1-methyl-3,4-epoxycyclohexyl] adipate, vinylcyclohexene diepoxide, polyepoxy compounds (each independently obtained by reacting a peracetic acid with a polydiene (such as polybutadiene or polyisoprene)), and epoxidized soybean oil.

In the present invention, it is preferred that at least 20% by weight, more advantageously 50 to 100% by weight of organic compound (b) is a compound having at least one functional group selected from the group consisting of an alicyclic functional group and an aromatic functional group. The mechanical strength and solvent resistance of the photosensitive resin composition can be improved by the use of organic compound (b) having an alicyclic functional group and/or an aromatic functional group. Examples of alicyclic functional groups contained in the organic compound (b) include a cycloalkyl group, a bicycloalkyl group, a cycloalkene skeleton and a bicycloalkene skeleton, and examples of organic compounds (b) having an alicyclic group include cyclohexyl methacrylate. Examples of aromatic functional groups contained in the organic compound (b) include a benzyl group, a phenyl group, a phenoxy group and a fluorene group, and examples of organic compounds (b) having an aromatic group include benzyl methacrylate and phenoxyethyl methacrylate. Organic compound (b) containing an aromatic functional group may be a heterocyclic type aromatic compound containing nitrogen, sulfur or the like as a heteroatom.

For improving the impact resilience of a printing plate obtained from the photosensitive resin composition of the present invention, the type of the organic compound (b) may be appropriately selected, based on the conventional knowledge on photosensitive resin compositions for forming printing plates (for example, a methacrylic monomer described in Unexamined Japanese Patent Application Laid-Open Specification No. Hei 7-239548 can be used).

The photosensitive resin composition of the present invention comprises inorganic porous material (c) which has an average pore diameter of from 1 nm to 1,000 nm, a pore volume of from 0.1 ml/g to 10 ml/g and a number average particle diameter of not more than 10 μm. Inorganic porous material (c) is inorganic microparticles having micropores and/or very small voids. When a cured form of the photosensitive resin composition of the present invention is decomposed by laser beam irradiation, viscous liquid debris composed of low molecular weight components (i.e., monomers and oligomers) is generated in a large amount. In the present invention, inorganic porous material (c) is used to perform an absorption removal of the generated liquid debris. Further, the presence of inorganic porous material (c) prevents the occurrence of surface tack of the printing plate. The removal of liquid debris by the inorganic porous material is a completely novel technique which has not conventionally been known. The photosensitive resin composition of the present invention which is capable of quickly removing the liquid debris is especially advantageous for the production of a flexographic printing plate, which production is accompanied by a generation of a large amount of engraving debris.

In the present invention, as mentioned above, inorganic microparticles are used as inorganic porous material (c). It is important that the inorganic microparticles are not molten or deformed by laser beam irradiation and maintain their pores and/or small voids. Therefore, with respect to the material of the inorganic porous material (c), there is no particular limitation so long as the material is not molten by laser beam irradiation. However, when it is intended to photocure the photosensitive resin composition of the present invention by ultraviolet light or visible light, the use of black microparticles as inorganic porous material (c) is unfavorable since the black particles cause a marked lowering of the transmission of light into the inner portion of the resin composition, thereby lowering the properties of the cured resin composition. Thus, black microparticles, such as carbon black, activated carbon and graphite, are not suitable as inorganic porous material (c) used in the resin composition of the present invention.

The characteristics and properties of inorganic porous material (c), such as a number average particle diameter, a specific surface area, an average pore diameter, a pore volume, an ignition loss and an oil absorption value, are very important factors for achieving an efficient removal of a viscous liquid debris. Among the conventional microparticles which are used as additives for a photosensitive resin composition, there are non-porous microparticles and porous microparticles having too small pores to absorb the liquid debris satisfactorily. In addition to the above-mentioned characteristics and properties of inorganic porous material (c), the molecular weight and viscosity of the photosensitive resin also have a great influence on the efficiency of the removal of the viscous liquid debris. In the present invention, it is necessary that inorganic porous material (c) has an average pore diameter of from 1 nm to 1,000 nm, a pore volume of from 0.1 ml/g to 10 ml/g and a number average particle diameter of not more than 10 μm.

The average pore diameter of inorganic porous material (c) has a great influence on the ability thereof to absorb the liquid debris which is generated during the laser engraving. The average pore diameter is in the range of from 1 nm to 1,000 nm, preferably from 2 nm to 200 nm, more preferably from 2 nm to 40 nm, most preferably from 2 nm to 30 nm. When the average pore diameter of an inorganic porous material is less than 1 nm, such an inorganic porous material is incapable of absorbing a satisfactory amount of the liquid debris generated during the laser engraving. On the other hand, when the average pore diameter of an inorganic porous material exceeds 1,000 nm, the specific surface area of such an inorganic porous material becomes too small to absorb a satisfactory amount of the liquid debris. The reason why an inorganic porous material having an average pore diameter of less than 1 nm cannot absorb a satisfactory amount of the liquid debris is not fully elucidated, but it is considered that the viscous liquid debris is difficult to enter into the micropores having such a small average pore diameter. Inorganic porous materials exhibit remarkable effect of absorbing the liquid debris especially when the porous materials have an average pore diameter of 40 nm or less. Among various porous materials, those which have an average pore diameter of from 2 to 30 nm are called "mesoporous materials". Such mesoporous materials are especially preferred in the present invention because the mesoporous materials have remarkably high ability to absorb the liquid debris. In the present invention, the average pore diameter is determined by the nitrogen adsorption method.

The pore volume of inorganic porous material (c) is in the range of from 0.1 ml/g to 10 ml/g, preferably from 0.2 ml/g to 5 ml/g. When the pore volume of an inorganic porous material is less than 0.1 ml/g, such an inorganic porous material is incapable of absorbing a satisfactory amount of the viscous liquid debris generated during the laser engraving. On the other hand, when the pore volume exceeds 10 ml/g, the mechanical properties of the particles become unsatisfactory. In the present invention, the pore volume is a value determined by the nitrogen adsorption method. Specifically, the pore volume is determined from a nitrogen adsorption isotherm obtained at −196° C.

In the present invention, the average pore diameter and the pore volume are calculated by BJH (Barrett-Joyner-Halenda) method, wherein a cylindrical model was postulated from the absorption isotherm during the elution of nitrogen. In the present invention, the average pore diameter and the pore volume are defined as follows. The pore volume is defined as the final cumulative pore volume in a curve obtained by plotting a cumulative pore volume against the pore diameter, and the average pore diameter is defined as the pore volume at a point in the above-mentioned curve where the cumulative pore volume becomes half of the final cumulative pore volume.

In the present invention, the number average particle diameter of the inorganic porous material (c) is 10 μm or less, preferably in the range of from 0.1 μm to 10 μm, more preferably from 0.5 to 10 μm, most preferably from 2 to 10 μm. In the present invention, the average particle diameter is determined by a laser scattering particle size distribution analyzer.

When a porous material having a number average particle diameter in the above-mentioned range is used in the photosensitive resin composition, a dust does not arise during the laser engraving of the printing element formed from the photosensitive resin composition, thereby preventing the engraving apparatus from being contaminated with dust. Further, when such an inorganic porous material is mixed with resin (a) and organic compound (b), the resultant mixture is free from problems, such as an increase in the viscosity of the resultant mixture, an incorporation of air bubbles into the mixture, and a generation of a large amount of dust.

On the other hand, when an inorganic porous material having a number average particle diameter of more than 10 μm is used to produce a photosensitive resin composition, disadvantages are likely to be caused wherein a relief pattern formed on a printing plate by laser engraving is chipped, so that an image of a print obtained using the relief pattern becomes imprecise. By the use of an inorganic porous material having a number average particle diameter of 10 μm or less in a photosensitive resin composition, it becomes possible to form a precise image of a relief pattern on a printing plate without leaving residual particles on the image of the relief pattern. A more specific explanation is given below. In the field where a highly precise image is required, a laser engraved pattern formed on a printing plate is composed of lines having a width of about 10 μm. When large particles having a particle diameter of more than 10 μm are present at the surface portion of a printing element, and such a printing element is subjected to laser engraving to form a relief pattern composed of grooves having a width of about 10 μm, the large particles are caused to remain in the grooves of the resultant image-bearing printing plate. Such a printing plate suffers from a disadvantageous phenomenon wherein an ink adheres to the inorganic porous particles remaining in the groves of the printing plate and the ink is transferred to the substrate, thereby causing printing defects. Further, when a large amount of particles having a particle diameter of more than 10 μm are contained in the printing element, problems arise in that the abrasion resistance of the printing plate during printing becomes lowered, and in that the particles exposed at the surface of the printing plate come off the printing plate, thereby forming chipped portions on the printing plate. When such a printing plate having chipped portions is used for printing, an ink cannot be transferred to a material to be printed at the chipped portions of the printing plate, thereby causing printing defects. These problems are more likely to occur in the case of the resin composition of the present invention containing resin (a) which is in a solid state at 20° C., as compared to the case of a resin composition containing a resin which is in a liquid state at 20° C. Therefore, in the present invention which uses resin (a) which is in a solid state at 20° C., use is made of an inorganic porous material having a number average particle diameter of 10 μm or less.

Further, it is to be noted that when use is made of an inorganic porous material having a number average particle diameter of 10 μm or less, the surface abrasion of a photosensitive resin composition becomes advantageously small and, as a result, adherence of a paper dust can be suppressed. In addition, a photocured photosensitive resin composition exhibits satisfactory level of tensile properties, such as tensile strength at break.

In addition, for further improving the absorption of the debris by inorganic porous material (c), it is preferred that inorganic porous material (c) has a specific surface area of from 10 $m^2/g$ to 1,500 $m^2/g$ and an oil absorption value of from 10 ml/100 g to 2,000 ml/100 g.

The specific surface area of inorganic porous material (c) is preferably in the range of from 10 $m^2/g$ to 1,500 $m^2/g$, more preferably from 100 $m^2/g$ to 800 $m^2/g$. When the specific surface area of an inorganic porous material is less than 10 $m^2/g$, the ability thereof to remove the liquid debris generated during laser engraving is likely to become unsatisfactory. On the other hand, when the specific surface area of an inorganic porous material exceeds 1,500 $m^2/g$, a disadvantage is likely to be caused that the viscosity of the photosensitive resin composition containing the inorganic porous material is increased and the thixotropy of the photosensitive resin composition is increased. In the present invention, the specific surface area is determined by the BET method using the nitrogen adsorption isotherm obtained at −196° C.

The oil absorption value of inorganic porous material (c) is an index for evaluating the amount of a liquid debris which the inorganic porous material can absorb, and it is defined as an amount of an oil absorbed by 100 g of the inorganic porous material. The oil absorption value of the inorganic porous material (c) used in the present invention is preferably in the range of from 10 ml/100 g to 2,000 ml/100 g, more preferably from 50 ml/100 g to 1,000 ml/100 g. When the oil absorption value of an inorganic porous material is less than 10 ml/100 g, it is likely that such an inorganic porous material cannot effectively remove the liquid debris generated by laser engraving. On the other hand, when the oil absorption value of an inorganic porous material exceeds 2,000 ml/100 g, the mechanical properties of such an inorganic porous material are likely to become unsatisfactory. The oil absorption value is determined in accordance with JIS-K5101.

Inorganic porous material (c) used in the present invention needs to maintain its porous structure without suffering distortion or melting by laser beam irradiation, especially infrared radiation. Therefore, it is desired that the ignition loss of inorganic porous material (c) at 950° C. for 2 hours is not more than 15% by weight, preferably not more than 10% by weight.

In order to evaluate the porous structure of a porous material, the present inventors have adopted a new parameter called "specific porosity". The "specific porosity" of porous particles is the ratio of the specific surface area (P) of the particles to the surface area (S) per unit weight of the particles, namely P/S, wherein S is a value calculated from the number average particle diameter (D) (unit: μm) of the particles and the density (d) (unit: $g/cm^3$) of a substance constituting the particles. With respect to the surface area (S) per unit weight of the porous particles, when the particles are spherical, the average surface area of the particles is $\pi D^2 \times 10^{-12}$ (unit: $m^2$) and the average weight of the particles is $(\pi D^3 d/6) \times 10^{-12}$ (unit: g). Accordingly, the surface area (S) per unit weight of the particles is calculated by the following formula:

$$S=6/(Dd) \text{ (unit: } m^2/g).$$

The number average particle diameter (D) is a value determined by a laser scattering particle size distribution analyzer. When the porous particles are not spherical, the specific porosity is calculated on the assumption that the particles are spheres having a number average particle diameter determined by a laser scattering particle size distribution analyzer.

The specific surface area (P) is a value calculated from the amount of molecular nitrogen adsorbed on the surface of a particle.

The specific surface area (P) increases as the particle diameter decreases and, therefore, the specific surface area alone is inappropriate as a parameter for defining the porous structure of a porous material. Therefore, the present inventors have adopted the above-mentioned "specific porosity" as a nondimensional parameter, taking into consideration the particle diameter of the porous material. It is preferred that the inorganic porous material (c) used in the present invention has a specific porosity of 20 or more, more advantageously 50 or more, most advantageously 100 or more. When the specific porosity of the inorganic porous material (c) is 20 or more, the inorganic porous material (c) is effective for the absorption removal of the liquid debris.

For example, carbon black, which is conventionally widely used as a reinforcing agent for a rubber and the like, has a very large specific surface area, namely 150 $m^2/g$ to 20 $m^2/g$, and has a very small average particle diameter, generally 10 nm to 100 nm. Since it is known that carbon black generally has a graphite structure, the specific porosity of carbon black can be calculated using the density of graphite, i.e., 2.25 $g/cm^3$. The specific porosity of carbon black obtained by such calculation is in the range of from 0.8 to 1.0, which indicates that carbon black is a non-porous material. On the other hand, each of the porous silica products used in the Examples of the present application has a specific porosity which is much larger than 500.

There is no particular limitation with respect to the shape of the particles of inorganic porous material (c), and each particle of inorganic porous material (c) may independently be in the form of a sphere, a polygon, a plate or a needle. Alternatively, inorganic porous material (c) may not have any definite shape or may be in the form of particles each having a projection(s) on the surface thereof. Further, inorganic porous material (c) may be in the form of hollow particles or spherical granules, such as silica sponge, which have uniform pore diameter. Specific examples of inorganic porous material (c) include a porous silica, a mesoporous silica, a silica-zirconia porous gel, a porous alumina, a porous glass, zirconium phosphate and zirconium silicophosphate. In addition, a lamellar substance, such as a lamellar clay compound, having voids between the layers can be also used as inorganic porous material (c), wherein the dimension of each void (distance between the layers) ranges from several to 100 nm. Since a pore diameter cannot be defined for such a lamellar substance, the dimension of the void between the layers thereof (i.e., the distance between the layers) is defined as a pore diameter.

From the viewpoint of surface abrasion resistance of a photocured photosensitive resin composition, it is preferred that inorganic porous material (c) comprises spherical particles or regular polyhedral particles, more advantageously spherical particles. With respect to the confirmation of the shape of particles of inorganic porous material (c), it is preferred that the confirmation is performed by using a scanning electron microscope. Even the shapes of particles having a number average particle diameter as small as about 0.1 μm can be confirmed by using a high resolution field emission scanning electron microscope. The spherical particles and regular polyhedral particles are preferred because even when such particles are exposed at the surface of the printing plate, the area of contact between the substrate and the particles becomes small. Further, the use of spherical particles also has the effect of suppressing the thixotropy of the photosensitive resin composition. It is considered that this thixotropy suppressing effect is caused by the great decrease in the area of contact among the particles contained in the photosensitive resin composition (i.e., caused by the very small contact area among the spherical particles as compared to that in the case of non-spherical particles).

In the present invention, the "spherical particle" is defined as a particle in which the entire surface thereof is curved, and encompasses not only a particle having a shape of a true sphere, but also a quasi-spherical particle. When a spherical particle used in the present invention is exposed to light from one direction to form a projected image of the particle on a two dimensional plane, the shape of the projected image is a circle, an oval or an ovoid. From the viewpoint of abrasion resistance of the photosensitive resin composition, it is preferred that the spherical particle has a shape which is as close to a true sphere as possible. In addition, the spherical particle may have very small concave and/or convex portions, wherein the depth and height of such portions are 1/10 or less, based on the diameter of the particle.

In the present invention, it is preferred that at least 70% of the inorganic porous material (c) is a spherical particle having a sphericity of from 0.5 to 1. In the present invention, the term "sphericity" is defined as a ratio $D_1/D_2$, wherein $D_1$ represents the diameter of a largest circle which is enclosed within a projected image of the spherical particle and $D_2$ represents the diameter of a smallest circle which encloses the projected image of the spherical particle therein. Since the sphericity of a true sphere is 1.0, the maximum value of the sphericity is 1. It is preferred that the sphericity of a spherical particle used in the present invention is in the range of from 0.5 to 1, more advantageously from 0.7 to 1. When a photosensitive resin composition is prepared using an inorganic porous material (c) having a sphericity of 0.5 or more, a printing element produced using such a photosensitive resin composition exhibits excellent abrasion resistance. It is preferred that at least 70%, more preferably 90%, of the inorganic porous material (c) is a spherical particle having a sphericity of 0.5 or more. The sphericity can be determined using a photomicrograph taken during an observation under a scanning electron microscope. It is preferred that the photomicrograph is taken in an observation performed at a magnification such that at least 100 particles can be observed on a monitor used in the observation. With respect to the determination of the above-mentioned $D_1$ and $D_2$ values using the obtained photomicrograph, it is preferred to perform the determination by a method in which the image on the photomicrograph is converted into digital data by using a scanner and the like and, then, the digital data is processed using a software for image analysis to determine the $D_1$ and $D_2$ values.

In the present invention, it is also preferred that inorganic porous material (c) is a regular polyhedral particle. In the present invention, the "regular polyhedral particle" encompasses not only a regular polygon having at least 4 planes but also a particle which is an approximation to a regular polygon. The particle which is an approximation to a regular polygon is a particle having a $D_3/D_4$ value of from 1 to 3, preferably 1 to 2, more preferably 1 to 1.5, wherein $D_3$ represents the diameter of a smallest sphere which encloses the regular polyhedral particle therein and $D_4$ represents the diameter of a largest sphere which is enclosed in the regular polyhedral particle. A regular polyhedral particle having an infinite number of planes is a spherical particle. The above-mentioned $D_3/D_4$ value can be determined in the same manner as mentioned above in connection with the determination of sphericity, by using a photomicrograph taken during an observation under a scanning electron microscope.

It is preferred that the standard deviation of the particle diameter distribution of inorganic porous material (c) used in the present invention is 10 μm or less, more advantageously 5 μm or less, still more advantageously 3 μm or less. In addition, it is preferred that the standard deviation of the particle diameter distribution is 80% or less, more preferably 60% or less, still more preferably 40% or less, based on the average particle diameter of inorganic porous material (c). With respect to inorganic porous material (c), when the standard deviation of the particle diameter distribution is not only 10 μm or less but also 80% or less, based on the average particle diameter, this means that particles having very large particle diameters are not included in inorganic porous material (c). By suppressing the amount of particles having a particle diameter which is much larger than the average particle diameter, it becomes possible to prevent an excessive increase in the thixotropy of the photosensitive resin composition and to obtain a photosensitive resin composition, thereby rendering easy the shaping of the composition into a sheet or cylinder. When a photosensitive resin composition having an excessively high thixotropy is shaped using an extruder, the shaping needs to be performed at a high temperature for fluidizing the resin composition. Further, the use of such a high thixotropy composition causes difficulty in the shaping process. Specifically, a torque (applied to a screw of an extruder) needed to move the resin composition in the extruder becomes large, thereby increasing the load on the extruder. Further, the time necessary for removing bubbles from the photosensitive resin composition becomes disadvantageously long. On the other hand, the use of an inorganic porous material having a narrow particle diameter distribution is advantageous for increasing the abrasion resistance of a cured photosensitive resin composition. The reason for this is considered as follows. The use of a material having a wide particle diameter distribution is likely to increase the amount of large particles (having a particle diameter larger than the average particle diameter) in the resin composition. Such large particles contained in the resin composition tend to be exposed on the surface of the printing plate and easily come off the printing plate. This tendency becomes greater in accordance with the increase in amount of large particles having a particle diameter of more than 10 μm.

Further, by the use of inorganic porous material (c) having a particle diameter distribution with a small standard deviation, it becomes possible to improve the notch property of the final printing element. In the present invention, the notch property is defined as follows. A printing element having a predetermined thickness and a predetermined width is used as a test specimen, and a notch having a predetermined depth is formed on the test specimen using a cutter knife. Then, the test specimen is bent at the notch so as to fold the test specimen with the notch turned on the outer side of the bent test specimen. With respect to the bent test specimen, the breakage-resistance time (time period of from the bending of the test specimen to the breakage of the test specimen) is measured. The thus measured breakage-resistance time is defined as the notch property. Therefore, a printing element having excellent notch property exhibits a long breakage-resistance time, and such a printing plate is not likely to suffer from defects, such as chipping of a fine pattern formed on the printing element. An excellent printing element preferably exhibits a breakage-resistance time of 10 seconds or more, more preferably 20 seconds or more, still more preferably 40 seconds or more.

In the present invention, inorganic porous material (c) having incorporated in its pores and/or voids an organic colorant (such as a pigment or a dye) which is capable of absorbing light having an wavelength of a laser beam can be used. However, carbon black is not suitable as inorganic porous material (c) for the following reason. In general, carbon black which has conventionally been used as an additive for a photosensitive resin is considered to have a graphite structure, namely a lamellar structure. In graphite, each interval between the layers is very small, namely 0.34 nm, so that the absorption of viscous liquid debris by carbon black is difficult. In addition, due to the black color of carbon black, it exhibits strong light absorbing properties with respect to a wide range of wavelengths (ranging from UV light to infrared light). Therefore, when carbon black is added to the photosensitive resin composition and the resultant resin composition is photocured with UV light and the like, it is necessary to limit the amount of the carbon black to a very small amount. Accordingly, carbon black is not suitable as inorganic porous material (c) which is used for the absorption removal of viscous liquid debris.

Further, the surface of the inorganic porous material may be modified by coating the surface thereof with a silane coupling agent, a titanium coupling agent or an organic compound, to thereby obtain particles having an improved hydrophilic or hydrophobic property.

In the present invention, the substances exemplified above as inorganic porous material (c) can be used individually or in combination. By the addition of inorganic porous material (c) to the photosensitive resin composition, it becomes possible to suppress the generation of liquid debris during the laser engraving of the printing element, and the resultant image-bearing printing plate not only has small surface tack and excellent abrasion resistance, but also is capable of suppressing the adherence of paper dust during the printing using the printing plate.

The amounts of resin (a), organic compound (b) and inorganic porous material (c) which are used in the photosensitive resin composition of the present invention are as follows. In general, the amount of organic compound (b) is 5 to 200 parts by weight, preferably 20 to 100 parts by weight, relative to 100 parts by weight of resin (a). The amount of inorganic porous material (c) is 1 to 100 parts by weight, preferably 2 to 50 parts by weight, more preferably 2 to 20 parts by weight, relative to 100 parts by weight of resin (a).

When the amount of organic compound (b) is less than 5 parts by weight, a printing plate or the like which is obtained from the photosensitive resin composition is likely to suffer from disadvantages, such as a difficulty in maintaining a good balance between the rigidity of the composition, and the tensile strength and elongation of the composition. When the amount of organic compound (b) exceeds 200 parts by weight, the photosensitive resin composition is likely to suffer from not only a marked cure shrinkage at the time of the crosslink-curing of the resin composition, but also a lowering of the uniformity in thickness of the resultant printing element.

When the amount of inorganic porous material (c) is less than 1 part by weight, depending on the types of resin (a) and organic compound (b) used, the prevention of surface tack and the removal of the liquid debris generated by laser engraving become unsatisfactory. On the other hand, when the amount of inorganic porous material (c) exceeds 100 parts by weight, a printing plate which is obtained using the photosensitive resin composition becomes fragile and loses transparency. Especially when a flexographic printing plate is produced using a resin composition containing too large an amount of inorganic porous material (c), the rigidity of such a flexographic printing plate may become too high. When a laser engravable printing element is formed by photocuring a photosensitive resin composition (especially when the photocuring is performed using UV light), the light transmittance of the resin composition influences the curing reaction. Therefore, as inorganic porous material (c), it is advantageous to use an inorganic porous material having a refractive index which is close to that of the photosensitive resin composition.

In the production of a laser engravable printing element from the photosensitive resin composition of the present invention, the photosensitive resin composition is crosslink-cured by irradiation thereof with a light or an electron beam. For promoting the crosslink-curing of the photosensitive resin composition, it is preferred that the photosensitive resin composition further comprises a photopolymerization initiator. A photopolymerization initiator can be appropriately selected from those which are customarily used. Examples of polymerization initiators usable in the present invention include a radical polymerization initiator, a cationic polymerization initiator and an anionic polymerization initiator, which are exemplified in "Koubunshi Deta Handobukku—Kisohen (Polymer Data Handbook—Fundamentals)" edited by Polymer Society Japan, published in 1986 by Baifukan Co., Ltd., Japan. In the present invention, the crosslink-curing of the photosensitive resin composition which is performed by photopolymerization using a photopolymerization initiator is advantageous for improving the productivity of the printing element while maintaining the storage stability of the resin composition. Representative examples of conventional photopolymerization initiators which can be used in the present invention include benzoin; benzoin alkyl ethers, such as benzoin ethyl ether; acetophenones, such as 2-hydroxy-2-methylpropiophenone, 4'-isopropyl-2-hydroxy-2-methylpropiophenone, 2,2-dimethoxy-2-phenylacetophenone and diethoxyacetophenone; photoradical initiators, such as 1-hydroxycyclohexyl phenyl ketone, 2-methyl-1-[4-(methylthio) phenyl]-2-morpholino-propane-1-one, methyl phenylglyoxylate, benzophenone, benzil, diacetyl, diphenylsulfide, eosin, thionine and anthraquinone; photocationic polymerization initiators, such as aromatic diazonium salt, an aromatic iodonium salt and an aromatic sulfonium salt, each of which generates an acid by absorbing a light; and photopolymerization initiators, each of which generates a base by absorbing a light. The photopolymerization initiator is preferably used in an amount of from 0.01 to 10% by weight, based on the total weight of resin (a) and organic compound (b).

In addition, depending on the use and desired properties of the photosensitive resin composition, other additives, such as a polymerization inhibitor, an ultraviolet absorber, a dye, a pigment, a lubricant, a surfactant, a plasticizer and a fragrance, may be added to the photosensitive resin composition.

The photosensitive resin composition of the present invention can be produced by mixing resin (a), polymerizable organic compound (b), inorganic porous material (c) and optionally other additive(s). Since resin (a) used in the present invention is in a solid state at 20° C., other components are mixed with resin (a) which has been liquefied or dissolved in a solvent. Specific examples of methods for mixing the components include a method in which resin (a) is fluidized by heating to thereby obtain a molten resin (a), and polymerizable organic compound (b) and inorganic porous material (c) are directly added to the molten resin (a); a method in which resin (a) and polymerizable organic compound (b) are kneaded while heating, and inorganic porous material (c) is added thereto; and a method in which a solvent is added to resin (a) to thereby obtain a resin (a) solution, and polymerizable organic compound (b) and inorganic porous material (c) are added to the resin (a) solution while stirring.

In another aspect of the present invention, there is provided a laser engravable printing element which is a cured photosensitive resin composition having a shape of a sheet or cylinder, wherein the laser engravable printing element contains an inorganic porous material. The laser engravable printing element of the present invention is a cured resin composition obtained by curing the above-mentioned photosensitive resin composition of the present invention.

The laser engravable printing element of the present invention is obtained by photocuring a photosensitive resin composition which comprises an inorganic porous material. Therefore, when the photosensitive resin composition of the present invention is used, a three-dimensionally crosslinked structure is formed by a reaction between the polymerizable unsaturated groups of organic compound (b) and/or between the polymerizable unsaturated groups of resin (a) and the polymerizable unsaturated groups of organic compound (b), and the resultant crosslinked resin composition becomes insoluble in the conventionally used solvents, such as esters, ketones, aromatic compounds, ethers, alcohols and halogenated solvents. That is, the above-mentioned reaction involves a reaction between organic compound (b) molecules, and when resin (a) has a polymerizable unsaturated group, the reaction also involves a reaction between resin (a) molecules and a reaction between a resin (a) molecule and an organic compound (b) molecule, thus consuming the polymerizable unsaturated groups.

When the resin composition is crosslink-cured using a photopolymerization initiator, the photopolymerization initiator is decomposed by light. The unreacted photopolymerization initiator and the decomposition products thereof can be identified by extracting the crosslink-cured product with a solvent and analyzing the extracted product by GC-MS (a method in which products separated by gas chromatography are analyzed by mass spectroscopy), LC-MS (a method in which products separated by liquid chromatography are analyzed by mass spectroscopy), GPC-MS (a method in which products separated by gel permeation chromatography are analyzed by mass spectroscopy), or LC-NMR (a method in which products separated by liquid chromatography are analyzed by nuclear magnetic resonance spectroscopy). Further, by the analysis of the above-mentioned extracted product by GPC-MS, LC-NMR or GPC-NMR, it is also possible to identify the unreacted resin (a), the unreacted organic compound (b) and relatively low molecular weight products formed by the reaction between the polymerizable unsaturated groups of resin (a) and/or compound (b). With respect to a high molecular weight component which has a three-dimensionally crosslinked structure and is insoluble in a solvent, the thermal gravimetric GC-MS can be used to confirm the presence of the structures which have been formed by the reaction between the polymerizable unsaturated groups. For example, the presence of a structure formed by a reaction between the polymerizable unsaturated groups, such as methacrylate groups, acrylate groups, vinyl groups of styrene monomers and the like, can be confirmed from the pattern of the mass spectrum. The thermal gravimetric GC-MS is a method in which a sample is decomposed by heat to thereby generate gas, and the generated gas is separated into components thereof by gas chromatography, followed by mass spectroscopic analysis of the separated components. When decomposed products derived from the photopolymerization initiator and/or an unreacted photopolymerization initiator are/is detected in the crosslink-cured product together with the unreacted polymerizable unsaturated groups and/or the structures formed by a reaction between the polymerizable unsaturated groups, it can be concluded that the analyzed product is one obtained by photocuring a photosensitive resin composition.

The amount of the inorganic porous material contained in a crosslink-cured resin composition can be determined by heating a crosslink-cured resin composition in air, thereby burning the organic components away from the resin composition, and measuring the weight of the residual product. Further, whether or not the residual product is the inorganic porous material can be determined by observation of the shape of the residual product under a high resolution scanning electron microscope, measurement of the pore diameter distribution by a laser scattering particle size distribution analyzer, and measurements of the pore volume, pore size distribution and specific surface area by the nitrogen adsorption method.

The laser engravable printing element of the present invention is a laser engravable printing element which is obtainable by a process comprising:

shaping the photosensitive resin composition of the present invention into a sheet or a cylinder, and crosslink-curing the photosensitive resin composition by light or electron beam irradiation.

With respect to the method for shaping the photosensitive resin composition of the present invention into a sheet or cylinder, any of conventional methods employed for shaping resins can be employed. For example, there can be mentioned an injection molding method; a method in which a resin is extruded from a nozzle or a die by using a pump or extruder, followed by adjustment of the thickness of the extruded resin using a blade; a method in which a resin is subjected to calendar processing using a roll, thereby obtaining a resin sheet having a desired thickness; and a coating method. During the shaping of the resin composition, the resin composition can be heated at a temperature which does not cause the lowering of the properties of the resin. Further, if desired, the shaped resin composition may be subjected to a treatment using a pressure roll or an abrasion treatment. In general, the resin composition is shaped on an underlay called "back film" which is made of PET (polyethylene terephthalate), nickel or the like. Alternatively, the resin composition can be shaped directly on a cylinder of a printing machine.

When the photosensitive resin composition contains a solvent, the solvent must be removed after shaping the resin composition. In general, removal of the solvent is preferably performed by air drying the shaped resin composition while heating at a temperature which is at least 20° C. below the boiling temperature of the solvent. For example, when the photosensitive resin composition is shaped by the coating method, the removal of the solvent becomes difficult when too large an amount of the resin composition is coated at once. Therefore, when the coating method is employed, it is preferred to repeat a sequence of the coating and the subsequent drying several times until a coating having a desired thickness is obtained.

The function of the above-mentioned "back film" is to impart dimensional stability to the printing element. Therefore, it is preferred to use a back film having a high dimensional stability. Preferred examples of materials for the back film include a metal, such as nickel, and a material having a coefficient of linear thermal expansion of not more than 100 ppm/° C., more preferably not more than 70 ppm/° C. Specific examples of materials for the back film include a polyester resin, a polyimide resin, a polyamide resin, a polyamideimide resin, a polyetherimide resin, a poly-bismaleimide resin, a polysulfone resin, a polycarbonate resin, a polyphenylene ether resin, a polyphenylene thioether resin, a polyethersulfone resin, a liquid crystal resin composed of a wholly aromatic polyester resin, a wholly aromatic polyamide resin, and an epoxy resin. Of these resins, a plurality of different resins may be used to produce a back film which is a laminate of layers of different resins. For example, a sheet formed by laminating a 50 μm-thick polyethylene terephthalate sheet on each side of a 4.5 μm-thick wholly aromatic polyamide film can be used. In addition, a porous sheet, such as a cloth obtained by weaving a fiber, a nonwoven fabric or a porous film obtained by forming pores in a non-porous film, can be also used as a back film. When a porous sheet is used as a back film, the porous sheet may be impregnated with a liquid photosensitive resin composition, followed by photocuring of the resin composition, to thereby unify the cured resin layer with the back film, so that it becomes possible to achieve a strong adhesion between the cured resin layer and the back film. Examples of fibers which can be used to form a cloth or nonwoven fabric include inorganic fibers, such as a glass fiber, an alumina fiber, a carbon fiber, an alumina-silica fiber, a boron fiber, a high silicon fiber, a potassium titanate fiber and a sapphire fiber; natural fibers, such as cotton and linen; semisynthetic fibers, such as a rayon, an acetate fiber and a promix fiber; and synthetic fibers, such as a nylon fiber, a polyester fiber, an acryl fiber, a vinylon fiber, a polyvinyl chloride fiber, a polyolefin fiber, a polyurethane fiber, a polyimide fiber and an aramid fiber. Cellulose produced by bacteria is a highly crystalline nanofiber, and it can be used to produce a thin nonwoven fabric having a high dimensional stability.

As a method for decreasing the coefficient of linear thermal expansion of the back film, there can be mentioned a method in which a filler is added to the back film, and a method in which a meshed cloth of an aromatic polyamide or the like, a glass cloth or the like is impregnated or coated with a resin. The fillers added to the back film may be conventional fillers, such as organic microparticles, inorganic microparticles of metal oxides or metals, and organic-inorganic composite microparticles. Further, the fillers may be porous microparticles, hollow microparticles, encapsulated microparticles or particles of compounds having a lamellar structure in which a low molecular weight compound is intercalated. Especially useful are microparticles of metal oxides, such as alumina, silica, titanium oxide and zeolite; latex microparticles comprised of a polystyrene-polybutadiene copolymer; a highly crystalline cellulose; and natural organic microparticles and fibers, such as a highly crystalline cellulose nanofiber produced by an organism.

The back film used in the present invention may be subjected to physical treatment or chemical treatment so as to improve the adhesion of the back film to the photosensitive resin composition layer or an adhesive agent layer formed on the back film. With respect to the physical treatment, there can be mentioned a sand blast method, a wet blast method (in which a liquid suspension of microparticles is sprayed), a corona discharge treatment, a plasma treatment, a UV light irradiation and a vacuum UV light irradiation. With respect to the chemical treatment, there can be mentioned a treatment with a strong acid, a strong alkali, an oxidation agent or a coupling agent.

The thus obtained shaped photosensitive resin composition is crosslink-cured by light or electron beam irradiation to obtain a printing element. The photosensitive resin composition may also be crosslink-cured by light or electron beam irradiation while shaping the photosensitive resin composition. However, it is preferred to perform the crosslink-curing with light since a simple apparatus can be used, and a printing element having a uniform thickness can be obtained. With respect to the light source used for curing, there can be mentioned a high pressure mercury lamp, an ultra-high pressure mercury lamp, an ultraviolet fluorescent lamp, a carbon arc lamp and a xenon lamp. The curing of the resin composition can be also performed by any other conventional methods for curing a resin composition. The photocuring can be performed by irradiating a light from a single light source, but lights of different light sources may be used in combination because the rigidity of the cured resin composition can be improved by performing the photocuring by two or more lights having different wavelengths.

The shaped photosensitive resin composition may be coated with a cover film to prevent oxygen from contacting the surface of the photosensitive resin composition during the light irradiation. The cover film may remain attached to the surface of the resultant printing element for surface protection, but the cover film must be peeled off before subjecting the printing element to laser engraving.

The thickness of the laser engravable printing element of the present invention can be appropriately selected depending on the use of the printing element. When the printing element is used for producing a printing plate, the thickness of the printing element is generally in the range of from 0.1 to 15 mm. Further, the printing element may be a multi-layered printing element comprising a plurality of layers made of different materials.

Accordingly, in still another aspect of the present invention, there is provided a multi-layered, laser engravable printing element comprising a printing element layer and at least one elastomer layer provided below the printing element layer. The multi-layered, laser engravable printing element of the present invention comprises the above-mentioned printing element of the present invention as a printing element layer, and at least one elastomer layer provided below the printing element layer. In general, the depth of the laser engraving on the printing element layer is 0.05 mm to several millimeters. The portion of the printing element which is positioned below the engraved portion may be made of a material other than the photosensitive resin composition of the present invention. The above-mentioned elastomer layer which functions as a cushion layer has a Shore A hardness of from 20 to 70, preferably from 30 to 60. When the Shore A hardness of the elastomer layer is in the above-mentioned range, the elastomer layer is capable of changing its shape appropriately so as to maintain the printing quality of the printing plate. When the Shore A hardness exceeds 70, such an elastomer layer is incapable of functioning as a cushion layer.

There is no particular limitation with respect to an elastomer used as a raw material for the elastomer layer so long as the elastomer has rubber elasticity. The elastomer layer may contain components other than an elastomer so long as the elastomer layer has a Shore A hardness in the above-mentioned range. As elastomers usable as raw materials for the elastomer layer, there can be mentioned a thermoplastic elastomer, a photocurable elastomer, a thermocurable elastomer and a porous elastomer having nanometer-size micropores. From the viewpoint of ease in producing a printing plate having a shape of a sheet or cylinder, it is preferred that the elastomer layer is produced by photocuring a resin which is in a liquid state at 20° C. (that is, a raw material which becomes an elastomer after being photocured).

Specific examples of thermoplastic elastomers used for producing the cushion layer include styrene thermoplastic elastomers, such as SBS (polystyrene-polybutadiene-polystyrene), SIS (polystyrene-polyisoprene-polystyrene) and SEBS (polystyrene-polyethylene/polybutylene-polystyrene); olefin thermoplastic elastomers; urethane thermoplastic elastomers; ester thermoplastic elastomers; amide thermoplastic elastomers; silicone thermoplastic elastomers; and fluoro thermoplastic elastomers.

As the photocurable elastomers, there can be mentioned a mixture obtained by mixing the above-mentioned thermoplastic elastomer with a photopolymerizable monomer, a plasticizer, a photopolymerization initiator and the like; and a liquid composition obtained by mixing a plastomer resin with a photopolymerizable monomer, a photopolymerization initiator and the like. In the present invention, differing from the production of a printing plate using a conventional printing element, in which a precise mask image should be formed on the printing element using light, the resin composition is cured by exposing the entire surface of the shaped article of the resin composition to light and, thus, it is not necessary to use a material having properties which are conventionally needed to form precise pattern on the printing element. Therefore, so long as the resin composition exhibits a satisfactory level of mechanical strength, there is a freedom of choice with respect to the raw materials used for producing the resin composition.

In addition to the elastomers mentioned above, it is also possible to use vulcanized rubbers, organic peroxides, primary condensates of a phenolic resin, quinone dioxime, metal oxides and non-vulcanized rubbers, such as thiourea.

Further, it is also possible to use an elastomer obtained by three dimensionally crosslinking a telechelic liquid rubber by using a curing agent therefor.

In the production of a multi-layered printing element, a back film may be formed either below the elastomer layer (that is, below the bottom of the printing element) or in between the printing element layer and the elastomer layer (that is, at a central portion of the multi-layered printing element).

In addition, a modifier layer may be provided on the surface of the laser engravable printing element of the present invention so as to decrease the surface tack and improve the ink wettability of the printing plate. Examples of modifier layers include a coating formed by a surface treatment with a compound, such as a silane coupling agent or a titanium coupling agent, which reacts with hydroxyl groups present on the surface of the printing element; and a polymer film containing porous inorganic particles.

As a compound which is widely used as a silane coupling agent, there can be mentioned a compound having in the molecule thereof a functional group which is highly reactive with hydroxyl groups present on the surface of a substrate. Examples of such functional groups include a trimethoxysilyl group, a triethoxysilyl group, a trichlorosilyl group, a diethoxysilyl group, a dimethoxysilyl group, a dimonochlorosilyl group, a monoethoxysilyl group, a monomethoxysilyl group and a monochlorosilyl group. At least one of these functional groups is present in each molecule of the silane coupling agent and the molecule is immobilized on the surface of a substrate by the reaction between the functional group and the hydroxyl groups present on the surface of the substrate. Further, the compound used as a silane coupling agent in the present invention may further contain in the molecule thereof at least one reactive functional group selected from the group consisting of an acryloyl group, a methacryloyl group, an amino group containing an active hydrogen, an epoxy group, a vinyl group, a perfluoroalkyl group and a mercapto group, and/or a long chain alkyl group.

Examples of titanium coupling agents include isopropyltriisostearoyl titanate, isopropyltris(dioctylpyrophosphate) titanate, isopropyltri(N-aminoethyl-aminoethyl)titanate, tetraoctylbis(di-tridecylphosphite) titanate, tetra(2,2-diallyloxymethyl-1-butyl)bis(di-tridecyl)phosphite titanate, bis (octylpyrophosphate)oxyacetate titanate, bis (dioctylpyrophosphate)ethylene titanate, isopropyltrioctanoyl titanate, isoproyldimethacrylisostearoyl titanate, isopropyltridodecylbenzenesulfonyl titanate, isopropylisostearoyldiacryl titanate, isopropyltri(dioctylsulfate) titanate, isopropyltricumylphenyl titanate and tetraisopropylbis(dioctylphosphite) titanate.

When the coupling agent which is immobilized on the surface of the printing plate has a polymerizable reactive group, the immobilized coupling agent may be crosslinked by irradiation with light, heat or electron beam to thereby further improve the strength of a coating formed by the coupling agent.

If desired, the above-mentioned coupling agent may be diluted with a mixture of water and an alcohol or a mixture of an aqueous acetic acid and an alcohol, to thereby obtain a coupling agent solution. The concentration of the coupling agent in the solution is preferably 0.05 to 10.0% by weight.

Hereinbelow, explanations are made on the methods for performing a coupling agent treatment. The above-mentioned coupling agent solution is applied to the surface of the printing element or the printing plate after laser engraving, to thereby form a coating of the coupling agent. There is no particular limitation with respect to the method for applying the coupling agent solution. For example, the application of the coupling agent solution may be performed by an immersing method, a spraying method, a roll coating method or a coating method using a brush. There is no particular limitation with respect to the coating temperature and the coating time, but it is preferred that the coating is performed at 5 to 60° C. for 0.1 to 60 seconds. It is preferred that the drying of the coupling agent solution layer formed on the surface of the printing element or the printing plate is performed by heating, and the preferred heating temperature is 50 to 150° C.

Before treating the surface of the printing element or printing plate with a coupling agent, the surface of the printing element or printing plate may be irradiated with vacuum ultraviolet light having a wavelength of not more than 200 nm by a xenon excimer lamp or exposed to a high energy atmosphere (such as plasma), to thereby generate hydroxyl groups on the surface of the printing element or printing plate. The thus generated hydroxyl groups are used to immobilize the coupling agent on the surface of the printing element or printing plate, so that the coupling agent can be immobilized at a high density on the surface of the printing element or printing plate.

When a printing element layer containing the particulate inorganic porous material is exposed at the surface of a printing plate, such a printing plate may be treated under a high energy atmosphere, such as plasma, so as to etch the surface layer (formed of an organic substance) slightly, thus forming minute concavo-convex portions on the surface of the printing plate. This treatment may decrease the surface tack and improve the ink wettability of the printing plate because the treatment enables the particulate inorganic porous material to absorb an ink more easily.

In still another aspect of the present invention, there is provided a method for producing a laser engraved printing element, which comprises: (i) forming a photosensitive resin composition layer on a support, wherein the photosensitive resin composition layer is obtained by shaping a photosensitive resin composition into a sheet or cylinder, (ii) crosslink-curing the photosensitive resin composition layer by light or electron bean irradiation, thereby obtaining a cured resin composition layer, and (iii) irradiating a portion of the cured resin composition layer which is preselected in accordance with a desired relief pattern, with a laser beam to ablate and remove the irradiated portion of the cured resin composition layer, thereby forming a relief pattern on the cured resin composition layer.

In step (i) of the method of the present invention for producing a laser engraved printing element, a photosensitive resin composition layer is formed on a support, wherein the photosensitive resin composition layer is obtained by shaping the photosensitive resin composition of the present invention into a sheet or cylinder. The shaping of the photosensitive resin composition can be performed in the same manner as mentioned above in connection with the method for producing the printing element of the present invention. Further, step (ii) of the method, namely the crosslink-curing of the photosensitive resin composition layer by light or electron bean irradiation to thereby obtain a cured resin composition layer, can be also performed in the same manner as mentioned above in connection with the method for producing the printing element of the present invention. A laser engravable printing element is obtained by performing steps (i) and (ii) of the method of the present invention.

In step (iii) of the method of the present invention, a portion of the cured resin composition layer which is preselected in accordance with a desired relief pattern is irradiated with a laser beam to ablate and remove the irradiated portion of the cured resin composition layer, thereby forming a relief pattern on the cured resin composition layer.

In a laser engraving process, a desired image is converted into digital data, and a relief pattern (corresponding to the desired image) is formed on the printing element by controlling a laser irradiation apparatus by a computer having the above-mentioned digital data. The laser used for the laser engraving may be any type of lasers so long as the laser comprises a light having a wavelength which can be absorbed by the printing element. For performing the laser engraving quickly, it is preferred that the output of the laser is as high as possible. Specifically, lasers having an oscillation in an infrared or near-infrared range, such as a carbon dioxide laser, a YAG laser, a semiconductor laser and a fiber laser, are preferred. Further, ultraviolet lasers having an oscillation in a ultraviolet light range, such an excimer laser, a YAG laser tuned to the third or fourth harmonics and a copper vapor laser, may be used for an abrasion treatment (which breaks the linkages in the organic compounds) and hence, are suitable for forming precise patterns. The laser irradiation may be either a continuous irradiation or a pulse irradiation. In general, a resin absorbs a light having a wavelength around 10 μm. Therefore, when a carbon dioxide laser having an oscillation wavelength around 10 μm is used, there is no need to add a component for facilitating the absorption of the laser beam. However, when a YAG laser which has an oscillation wavelength of 1.06 μm is used, since most organic compounds do not absorb light having a wavelength of 1.06 μm, it is usually necessary to add a component, such as a dye or a pigment, for facilitating the absorption of a laser beam. Examples of dyes include a poly(substituted)-phthalocyanine compound and a metal-containing phthalocyanine compound, a cyanine compound, a squalilium dye, a chalcogenopyryloallylidene dye, a chloronium dye, a metal thiolate dye, a bis(chalcogenopyrylo)polymethine dye, an oxyindolidene dye, a bis(aminoaryl)polymethine dye, a melocyanine dye and a quinoid dye. Examples of pigments include dark colored inorganic pigments, such as carbon black, graphite, copper chromite, chromium oxide, cobalt chromium aluminate and iron oxide; powders of metals, such as iron, aluminum, copper and zinc, and doped metal powders which are obtained by doping any of the above-mentioned metal powders with Si, Mg, P, Co, Ni, Y or the like. These dyes and pigments can be used individually or in combination. When a plurality of different dyes or pigments are used in combination, they can be combined in any form. For example, different dyes or pigments may be used together in such a form as having a laminate structure. However, when a photosensitive resin composition is cured by irradiation with ultraviolet or visible light, for curing an inner portion of the printing element as well as an outer portion thereof, it is preferred to avoid the use of a pigment and dye which absorb light having the same wavelength as that of a light used for curing of the resin composition.

The laser engraving is performed in an atmosphere of oxygen-containing gas, generally in the presence of or under the flow of air; however, it can be also performed in an atmosphere of carbon dioxide gas or nitrogen gas. After completion of the laser engraving, powdery or liquid debris which is present in a small amount on the surface of the resultant relief printing plate may be removed by an appropriate method, such as washing with a mixture of water with a solvent or surfactant, high pressure spraying of an aqueous detergent or spraying of a high pressure steam.

In the method of the present invention, the laser beam irradiation is preferably performed while heating a portion of the cured photosensitive resin layer. In general, a laser beam intensity has a Gaussian distribution, wherein the center of the beam corresponds to the peak of the distribution. Therefore, with respect to the intensity and temperature of a laser beam, the closer is a measurement point to the center of the beam, the higher the intensity and temperature of the beam, whereas the farther is a measurement point from the center of the beam, the lower the intensity and temperature of the beam. Further, in general, when a printing element is a cured resin composition containing, as a main component thereof, a resin which is in a solid state at 20° C., such a printing element has a high heat decomposition temperature. Therefore, the temperature of a laser beam around the circumference thereof is insufficient for heat decomposition of the resin forming the printing plate and, as a consequence, the decomposition of the resin becomes incomplete and debris remains on the resultant image-bearing printing plate, especially at the edge portion of the relief formed by laser engraving. Therefore, by heating the cured photosensitive resin layer of the printing element during the laser beam irradiation, the decomposition of the desired portion of the resin by laser beam irradiation can be facilitated.

There is no particular limitation with respect to the method for heating the cured photosensitive resin layer of the printing element. For example, there can be mentioned a method in which a base plate (in the form of a plate or cylinder) of the laser engraving apparatus is heated directly by a heater; and a method in which a cured thermoplastic resin layer is directly heated by an infrared ray heater. The efficiency in laser engraving can be improved by performing such heating operation. The heating temperature is preferably 50° C. to 200° C., more preferably 80° C. to 200° C., still more preferably 100° C. to 150° C. There is no particular limitation with respect to the heating time. The heating time may vary depending on the heating method and the laser engraving method. The cured photosensitive resin layer of the printing element is heated while performing the laser engraving so that the temperature of the cured photosensitive resin layer falls in the above-mentioned range.

After performing the laser engraving, the surface of the resultant printing plate may be subjected to physical treatment or chemical treatment. With respect to the chemical or physical treatment, there can be mentioned a method in which a printing plate is coated with or immersed in a treatment liquid containing a photopolymerization initiator and, then, the resultant printing plate is irradiated with a light having a wavelength in the UV range; a method in which a printing plate is subjected to a UV light or electron ray irradiation; and a method in which a thin layer having solvent resistance or abrasion resistance is formed on the surface of a printing plate.

The printing element of the present invention can be advantageously used not only for forming a relief pattern of a printing plate, but also for the production of a stamp and seal; a design roll for embossing; a relief pattern (used in the production of an electronic part, an optical part or a part relating to a display) for forming a pattern using a paste or ink of an insulating material, a resistive material, a conductive material or a semiconductive material (including an organic semiconductive material); a relief pattern for a mold used for producing potteries; a relief pattern for an advertisement or display board; and molds for various molded articles.

BEST MODE FOR CARRYING OUT THE INVENTION

Hereinbelow, the present invention will be described in more detail with reference to the following Examples and Comparative Examples, but they should not be construed as limiting the scope of the present invention.

In the following Examples and Comparative Examples, various properties and characteristics of photosensitive resin compositions were evaluated and measured as follows.

(1) Number Average Molecular Weight of Resin (a)

The number average molecular weight of resin (a) was measured by gel permeation chromatography (GPC), wherein a calibration curve prepared using standard polystyrene samples was used. Specifically, GPC was performed by a high performance GPC apparatus (HLC-8020; manufactured and sold by Tosoh Corporation, Japan) and a polystyrene-packed column (trade name: TSKgel GMHXL; manufactured and sold by Tosoh Corporation, Japan) wherein tetrahydrofuran (THF) was used as a carrier. The column temperature was maintained at 40° C. A THF solution containing 1% by weight of a resin was used as a sample and 10 μl of the sample was charged to the GPC apparatus. A UV absorption detector was used as a detector and a light having a wavelength of 254 nm was used as a monitoring light.

(2) Softening Temperature

The softening temperature of a resin was measured by a viscoelastic measurement apparatus, namely a rotary rheometer (trade name: RMS-800; manufactured and sold by Rheometrics Scientific FE, Ltd., Japan). The softening temperature was measured under conditions wherein the test frequency was 10 rad/second and the temperature of a resin was elevated from room temperature at a rate of 10° C./minute. The softening temperature is defined as the temperature at which the viscosity of the resin decreases drastically.

(3) Laser Engraving

Laser engraving was performed by a carbon dioxide laser engraving apparatus (trade name: TYP STAMPLAS SN 09; manufactured and sold by Baasel Lasertech, Germany). The laser engraved pattern included portions corresponding to halftone dots (screen ruling=80 lpi (lines per inch), and total area of halftone dots=approximately 10%, based on the halftone area of a print obtained using the engraved pattern), 500 μm-wide relief lines (convex lines) and 500 μm-wide reverse lines (grooves). When it is attempted to perform laser engraving under conditions wherein the engraving depth becomes large, a problem arises in that a satisfactorily area of the top portion of a fine halftone relief pattern cannot be obtained, so that the destruction of the portions corresponding to halftone dots occurs and the printed dots become unclear. For preventing this problem, the laser engraving was performed under conditions wherein the engraving depth is 0.55 mm.

(4) Frequency of Wiping Needed to Remove the Debris and Relative Amount of the Residual Debris Debris on the printing element after laser engraving was wiped away with a nonwoven fabric (trade name: BEMCOT M-3; manufactured and sold by Asahi Kasei Corporation, Japan) which was impregnated with ethanol or acetone. The frequency of wiping needed to remove the debris was defined as the number of times the wiping was performed to remove the viscous liquid debris generated during the laser engraving. A large frequency of wiping means that a large amount of liquid debris was present on the printing plate. It is preferred that the frequency of wiping needed to remove the debris is not more than 5 times, more advantageously not more than 3 times.

Further, the weight of a printing element before laser engraving, the weight of the printing element immediately after the laser engraving and the weight of a relief printing plate after wiping were measured. The relative amount of the residual debris was calculated in accordance with the following formula:

$$\frac{\text{(Weight of a printing element immediately after laser engraving)} - \text{(Weight of a relief printing plate after wiping)}}{\text{(Weight of a printing element before laser engraving)} - \text{(Weight of a relief printing plate after wiping)}} \times 100$$

It is advantageous when a printing plate has the residual debris in an amount of not more than 15% by weight, preferably not more than 10% by weight.

(5) Tack on the Surface of a Relief Printing Plate

Tack on the surface of a relief printing plate after wiping was measured by a tack tester (manufactured and sold by Toyo Seiki Seisaku-Sho Ltd., Japan). Specifically, an aluminum ring having a radius of 50 mm and a width of 13 mm was attached to a smooth portion of a relief printing plate (test specimen) at 20° C. so that the aluminum ring stood vertically on the specimen. A load of 0.5 kg was applied to the aluminum ring for 4 seconds. Subsequently, the aluminum ring was pulled at a rate of 30 mm per minute and the resisting force at the time of the detachment of the aluminum ring was measured by a push-pull gauge. The larger the resisting force, the larger the surface tack (tackiness) and the adhesive strength of the specimen. It is advantageous when the surface tack of a printing plate is not more than 150 N/m, preferably not more than 100 N/m.

(6) Evaluation of Portions of a Relief Pattern which Correspond to Halftone Dots With respect to the laser engraved printing plate (having a relief pattern formed thereon) obtained by the method of item (3) above, the portions of the relief pattern which correspond to the halftone dots (screen ruling=80 lpi (lines per inch), and total area of halftone dots=approximately 10%, based on the halftone area of a print obtained using the engraved pattern) were observed under an electron microscope with a magnification of 200 to 500. It is advantageous when the portions of the relief pattern which correspond to the halftone dots have a cone shape or cone-like shape (i.e., truncated cone in which the apex of a cone is removed so that the plane at the top portion of the resultant cone is parallel to the base of the cone).

(7) Pore Volume, Average Pore Diameter and Specific Surface Area of a Porous or Non-Porous Material 2 g of a porous or non-porous material as a sample was placed in a test tube and vacuum-dried for 12 hours by a pretreatment apparatus at 150° C. under 1.3 Pa or less. The pore volume, average pore diameter and specific surface area of the dried porous or non-porous material were measured by "Autosorb-3 MP" (manufactured and sold by Quantachrome Instruments, U.S.A.), wherein nitrogen gas was adsorbed on the porous or non-porous material in an atmosphere cooled by liquid nitrogen. Specifically, the specific surface area was calculated by the BET formula. With respect to the pore volume and average pore diameter, a cylindrical model was postulated from the adsorption isotherm during the elution of nitrogen, and the pore volume and average pore diameter were calculated by the BJH (Barrett-Joyner-Halenda) method which is a conventional method for analyzing pore distribution.

(8) Ignition Loss of the Porous or Non-Porous Material

The weight of a sample of a porous or nonporous material was measured and recorded. Subsequently, the sample was heated using a high temperature electric furnace (FG31 type; manufactured and sold by Yamato Scientific Co., Ltd., Japan) in air at 950° C. for 2 hours. The difference in the weight of the sample as between before and after the heating was defined as the ignition loss.

(9) Standard Deviation of the Particle Diameter Distribution of the Porous or Non-Porous Material The particle diameter distribution of the porous or non-porous material was determined by a laser scattering particle size distribution analyzer (SALD-2000J type; manufactured and sold by Shimadzu Corporation, Japan). According to the manufacture's catalogue, this analyzer is capable of measuring the particle diameter in the range of from 0.3 μm to 500 μm. A sample for analysis was prepared by adding the porous or non-porous material to methyl alcohol as a dispersion medium and subjecting to sonication for about 2 minutes, thereby obtaining a dispersion.

(10) Viscosity

The viscosity of a resin composition was measured by a B type viscometer (B8H type; manufactured and sold by Kabushiki Kaisha Tokyo Keiki, Japan) at 20° C.

(11) Taber Abrasion

Taber abrasion was measured in accordance with JIS-K6264. Specifically, the abrasion loss was determined after performing the Taber abrasion test under conditions wherein the load applied to a test specimen was 4.9 N, the rotation speed of a rotary disc was 60±2 times per minute, and the test was performed continuously for 1000 times. The area of the tested portion of the test specimen was 31.45 $cm^2$.

From the viewpoint of operational stability, it is preferred that the abrasion loss of a printing plate is as small as possible. An excellent printing plate has an abrasion loss of 80 mg or less, and when the abrasion loss is small, the printing plate can be used for a long period time and provides high quality printed materials.

(12) Surface Abrasion Resistance

Surface abrasion resistance (μ) was measured by an abrasion tester (TR type; manufactured and sold by Toyo Seiki Seisaku-Sho, Ltd., Japan). The sinker placed on the test specimen was a cube having a size of 63.5 mm×63.5 mm×63.5 mm and a weight (W) of 200 g, and the rate for pulling the sinker was 150 mm/minute. Further, a paper liner (trade name: K-liner; manufactured and sold by Oji Paper Co., Ltd., Japan) (i.e., a paper made of pure pulp and containing no recycled paper, which has a thickness of 220 μm and is used for producing a cardboard) was attached to the surface of the sinker so that a smooth surface of the paper liner was exposed. The resultant sinker was placed on the printing element so that the paper liner was positioned between the printing element and the sinker, and that the smooth surface of the paper liner was in contact with the surface of the printing element. The sinker was moved in a horizontal direction to measure the surface abrasion resistance (μ) of the printing element. The surface abrasion resistance (μ) was defined as the ratio of the load (Fd) applied to the sinker (which is a measured value) to the weight (W) of the sinker, namely the dynamic friction coefficient represented by $\mu = Fd/W$. This value is a non-dimensional number. The Fd value was an average of the load values obtained when the load applied to the sinker became relatively constant, that is, when the position of the sinker moved was in the range of 5 mm to 30 mm from the start point of the pulling of the sinker.

A printing element which exhibits a small surface abrasion resistance (μ) is advantageous. An excellent printing element has a surface abrasion resistance (μ) of 2.5 or less. When the surface abrasion resistance (μ) of a printing element is small, only a small amount of paper dust attaches to the surface of a printing plate during printing and the quality of a printed material obtained using the printing plate becomes high. When the surface abrasion resistance (μ) is more than 4, paper dusts attach to the surface of the printing plate when the printing plate is used to print a target paper material (such as a cardboard), and the printed material may suffer from many defects which are caused by the ink which has been attached to the paper dusts and has not been transferred to the target paper material (such as a cardboard).

(13) Notch Breakage-Resistance Time

A printing element having a width of 20 mm and a predetermined thickness was prepared for use as a test specimen. A notch having a depth of 1 mm was formed using an NT cutter (L-500RP type; manufactured and sold by NT Inc. & Cutters, Japan) in the widthwise direction. Then, the test specimen was bent at the notch so as to fold the test specimen such that the notch is exposed at the outer side of the bent test specimen. With respect to the bent test specimen, the notch breakage-resistance time (time period of from the bending of the test specimen to the breakage of the test specimen) was measured. An excellent printing element preferably exhibits a notch breakage-resistance time of 10 seconds or more, more preferably 20 seconds or more, still more preferably 40 seconds or more.

Examples 1 to 4 and Comparative Examples 1 and 2

A photosensitive resin composition was produced using a styrene-butadiene copolymer (hereinafter, referred to as "SBS") (trade name: Tufprene A; manufactured and sold by Asahi Kasei Corporation, Japan) (a thermoplastic elastomer resin which is in a solid state at 20° C.) as resin (a) and other components (organic compound (b), inorganic porous material (c), photopolymerization initiator and other additives) which are shown in Table 1. Specifically, in accordance with the formulation shown in Table 1, all of the components were charged into an open kneader (FM-NW-3 type; manufactured and sold by Powrex Corporation, Japan) and kneaded at 150° C. in air. Then, the resultant was allowed to stand still for 1 hour, thereby obtaining a photosensitive resin composition.

The number average molecular weight and softening temperature of the SBS used as resin (a) were 77,000 and 130° C., respectively.

The characteristics of organic compound (b) used in the Examples and the Comparative Examples are shown in Table 2.

As inorganic porous material (c), the following porous microparticulate silica products (each manufactured and sold by Fuji Silysia Chemical Ltd., Japan) were used:

C-1504 (trade name: SYLOSPHERE C-1504)

(number average particle diameter: 4.5 μm, specific surface area: 520 $m^2/g$, average pore diameter: 12 nm, pore volume: 1.5 ml/g, ignition loss: 2.5% by weight, oil absorption value: 290 ml/100 g, specific porosity (defined above): 780, standard deviation of the particle diameter distribution: 1.2 μm (27% of the number average particle diameter), and sphericity: almost all particles had a sphericity of 0.9 or more as measured under a scanning electron microscope); and C-450 (trade name: SYLYSIA 450)

(number average particle diameter: 8.0 μm, specific surface area: 300 $m^2/g$, average pore diameter: 17 nm, pore volume: 1.25 ml/g, ignition loss: 5.0% by weight, oil absorption value: 200 ml/100 g, specific porosity: 800, standard deviation of the particle diameter distribution: 4.0 μm (50% of the number average particle diameter), and the particles were porous but did not have a definite shape (i.e., C-450 was not a spherical silica product).

In addition, the below-mentioned silica product (manufactured and sold by PPG Industries Inc., U.S.A.) which has no definite shape was used in Comparative Example 2:

HiSil928 (trade name: HiSil928)

(number average particle diameter: 13.7 μm, specific surface area: 210 $m^2$ μg, average pore diameter: 50 nm, oil absorption value: 243 ml/100 g, specific porosity: 950, standard deviation of the particle diameter distribution: 12 μm (88% of the number average particle diameter), and the particles were porous but did not have a definite shape (i.e., HiSil928 was not a spherical silica product).

(The above-mentioned values of number average particle diameter and oil absorption value are those described in the manufacturer's catalog. Other values were obtained by the measurements conducted by the present inventors. The specific porosity was calculated by the above-mentioned method using the density (2 $g/cm^3$) of each of the porous materials.)

The obtained photosensitive resin composition was shaped into a sheet (thickness: 2.8 mm) on a PET (polyethylene terephthalate) film by heat pressing. Then, the obtained sheet was coated with a PET cover film (thickness: 15 μm). The resultant sheet was photocured by ALF type 213E exposure apparatus (manufactured and sold by Asahi Kasei Corporation, Japan) and an ultraviolet low pressure mercury lamp ("FLR20S•B-DU-37C/M"; manufactured and sold by Toshiba Corporation, Japan) (emission wavelength: 350 to 400 nm, peak wavelength: 370 nm). The exposure was performed in vacuo, in which the upper surface of the sheet (on which a relief pattern was to be formed) was exposed at 2000 $mJ/cm^2$ and the other surface of the sheet was exposed at 1000 $mJ/cm^2$, thereby obtaining a printing element.

A relief pattern was engraved on the obtained printing element by a laser engraving apparatus (manufactured and sold by Baasel Lasertech, Germany), and the resultant was evaluated. The results are shown in Table 3.

In each of Examples 1, 2 and 4 and Comparative Example 2, another printing element having a thickness of 2.8 mm was produced separately from the above, and used as a test specimen for measuring the Taber abrasion. The results are shown in Table 4.

As can be seen from Table 4, the abrasion loss of the printing element prepared using a spherical silica product (SYLOSPHERE C-1504) (Examples 1 and 4) was small as compared to that of the printing element prepared using a silica product (SYLYSIA 450 or HiSil928) having no definite shape (Example 2 and Comparative Example 2).

Further, in each of Examples 2 and 4 and Comparative Example 2, still another printing element having a thickness of 2.8 mm was produced using the obtained photosensitive resin composition, and used as a test specimen for measuring the surface abrasion resistance (μ) by an abrasion tester (TR type; manufactured and sold by Toyo Seiki Seisaku-Sho, Ltd., Japan). The surface abrasion resistances (μ) of the printing elements of Example 4, Example 2 and Comparative Example 2 were 2.5, 3.2 and 5.0, respectively. Since the surface abrasion resistance (μ) of the printing element of Comparative Example 2 was larger than 4, as mentioned above, this printing element is likely to suffer from many printing defects.

The notch breakage-resistance time was measured for each of the photosensitive resin compositions of Examples 1, 2 and 4 and Comparative Examples 1 and 2. The notch breakage-resistance times of the photosensitive resin compositions of Examples 1, 2 and 4 were advantageously long, namely 65 seconds, 40 seconds and 60 seconds, respectively. On the other hand, both the notch breakage-resistance times of the photosensitive resin compositions of Comparative Examples 1 and 2 were disadvantageously short, namely less than 10 seconds.

Example 5

A photosensitive resin composition in a liquid state (trade name: APR,F320; manufactured and sold by Asahi Kasei Corporation, Japan) was shaped into a sheet having a thickness of 2 mm, and the shaped resin composition was photocured in the same manner as in Example 1 to obtain an elastomer sheet. The obtained elastomer sheet was used as an elastomer layer (cushion layer) of the below-mentioned multi-layered printing element. On the above-obtained elastomer sheet was coated the photosensitive resin composition produced in Example 1 so as to form a coating having a thickness of 0.8 mm. The photosensitive resin composition coating was photocured in the same manner as in Example 1 to thereby obtain a multi-layered printing element. The Shore A hardness of the cushion layer was 55.

A relief pattern was engraved on the obtained multi-layered printing element, and the resultant was evaluated. The relative amount of residual debris was 5.7% by weight, the frequency of wiping needed to remove the debris was not more than 3 times and the tack on the printing element after wiping was 83 N/m. The portions of the relief pattern, which correspond to halftone dots, had an excellent cone shape.

Example 6

A photosensitive resin composition in a liquid form was prepared using 100 parts by weight of a polysulfone resin (trade name: Udel P-1700, manufactured and sold by Amoco Polymer, U.S.A.) which is a non-elastomeric thermoplastic resin; 50 parts by weight of organic compound (b) used in Example 1; 5 parts by weight of inorganic porous material (c) (trade name: SYLOSPHERE C-1504, manufactured and sold by Fuji Silysia Chemical Ltd., Japan); 0.6 part by weight of 2,2-dimethoxy-2-phenylacetophenone as a photopolymerization initiator; 0.5 part by weight of 2,6-di-t-butylacetophenone as an additive; and 50 parts by weight of tetrahydrofuran (THF) as a solvent. All of the above-mentioned components were charged into a separable flask equipped with agitating blades and a motor (trade name: Three One Motor), and the resultant mixture were agitated, thereby obtaining a photosensitive resin composition in a liquid state.

The polysulfone resin used was in a solid state at 20° C., and had a number average molecular weight of 27,000 and a softening temperature of 190° C.

A 50 μm-thick wholly aromatic polyamide film (trade name: Aramica; manufactured and sold by Asahi Kasei Corporation, Japan) which had been subjected to plasma treatment was coated with the above-obtained photosensitive resin composition in a liquid state so as to form a coating having a thickness of 1.5 mm. Since the photosensitive resin composition contained THF as a solvent, the above-mentioned coating having a thickness of 1.5 mm was prepared by repeating a sequence of the coating and the subsequent drying under air for 3 times. The resultant was dried in a dryer to remove THF completely, thereby obtaining a shaped resin article. The shaped resin article was photocured by ALF type 213E exposure apparatus (manufactured and sold by Asahi Kasei Corporation, Japan). The exposure was performed for 10 minutes in vacuo, in which the upper surface of the sheet (on which a relief pattern was to be formed) was exposed at 2000 $mJ/cm^2$ and the other surface of the sheet was exposed at 1000 $mJ/cm^2$, thereby obtaining a multi-layered printing element.

A relief pattern was engraved on the obtained multi-layered printing element by a carbon dioxide laser engraving apparatus, thereby obtaining a relief printing plate, and the obtained relief printing plate was evaluated. The relative amount of residual debris was 7.5% by weight, the frequency of wiping needed to remove the debris was not more than 3 times and the tack on the relief printing plate after wiping was 80 N/m. The portions of the relief pattern, which correspond to halftone dots, had an excellent cone shape.

Example 7

A photosensitive resin composition in a liquid state was prepared using, as resin (a), a combination of 70 parts by weight of a polysulfone resin (trade name: Udel P-1700; manufactured and sold by Amoco Polymer, U.S.A.) which is a non-elastomeric thermoplastic resin and 30 parts by weight of a solvent-soluble polyimide resin (Mn=100,000); 50 parts by weight of organic compound (b) used in Example 4; 5 parts by weight of inorganic porous material (c) (trade name: SYLOSPHERE C-1504; manufactured and sold by Fuji Silysia Chemical Ltd., Japan); 0.6 part by weight of 2,2-dimethoxy-2-phenylacetophenone as a photopolymerization initiator; 0.5 part by weight of 2,6-di-t-butylacetophenone as an additive; and 50 parts by weight of tetrahydrofuran (THF) as a solvent. All of the above-mentioned components were mixed together and stirred, thereby obtaining a photosensitive resin composition in a liquid state.

Using the obtained photosensitive resin composition, a printing plate was prepared in the same manner as in Example 6. The relative amount of residual debris was 7.5% by weight, the frequency of wiping needed to remove the debris was not more than 3 times and the tack on the relief printing plate after wiping was 50 N/m. The portions of the relief pattern, which correspond to halftone dots, had an excellent cone shape.

Example 8

Production of a photosensitive resin composition and production of a printing element were performed in the same manner as in Example 1. The produced printing element was subjected to laser engraving while heating the printing element to 120° C. by an infrared heater.

With respect to the laser engraved printing plate (having a relief pattern formed thereon), the portions of the relief pattern which correspond to the halftone dots were observed under a scanning electron microscope. In the printing plate obtained above, the amount of engraving debris attached to the edge portions of the relief pattern which were difficult to remove was advantageously suppressed, as compared to the case of the printing plate obtained in Example 1. Thus, it was more advantageous to perform the laser engraving while heating the printing element.

Comparative Example 3

A printing element was produced in substantially the same manner as in Example 1 except that organic porous spherical particles were used instead of inorganic porous material (c). The organic porous spherical particles were crosslinked polystyrene particles having a number average particle diameter of 8 μm, a specific surface area of 200 $m^2$/g and an average pore diameter of 50 nm. When the organic porous microparticles were observed under a scanning electron microscope, almost all of the particles were spherical.

When a relief pattern was engraved on the obtained printing element, a large amount of viscous liquid debris was generated and the frequency of wiping needed to remove the debris became more than 30 times. The reason for this is considered that the melting and decomposition of the organic porous spherical particles were caused by the laser irradiation and the organic porous spherical particles were unable to maintain the porous structure thereof.

Comparative Example 4

A printing element was produced in substantially the same manner as in Example 1 except that a substantially nonporous material, namely aluminosilicate (trade name: Silton AMT25; manufactured and sold by Mizusawa Industrial Chemicals, Ltd.), was used instead of inorganic porous material (c). The substantially nonporous material had an average particle diameter of 2.9 μm, a pore volume of 0.006 ml/g and a specific surface area of 2.3 $m^2$/g, and exhibited an oil absorption value of 40 ml/100 g. The specific porosity (which was obtained by the above-mentioned method using the density (2 g/$cm^3$) of the material) was 2.2. The standard deviation of the particle diameter distribution was 1.5 μm (52% of the number average particle diameter). When the substantially non-porous microparticles were observed under a scanning electron microscope, almost all of the particles were regular polygon.

When a relief pattern was engraved on the obtained printing element, a large amount of viscous liquid debris was generated and the frequency of wiping needed to remove the debris became more than 10 times. Although the shape of the portions of the relief pattern which correspond to the halftone dots was a cone, the tack on the relief printing plate after wiping was as high as 350 N/m. Further, the abrasion loss measured by Taber abrasion testing was 80 mg.

Comparative Example 5

A printing element was produced in substantially the same manner as in Example 1 except that a substantially nonporous material, namely sodium calcium aluminosilicate (trade name: Silton JC50, manufactured and sold by Mizusawa Industrial Chemicals, Ltd.), was used instead of inorganic porous material (c). The substantially nonporous material had an average particle diameter of 5.0 μm, a pore volume of 0.02 ml/g, and a specific surface area of 6.7 $m^2$/g, and exhibited an oil absorption value of 45 ml/100 g. The specific porosity (obtained by the above-mentioned method using the density (2 g/$cm^3$) of the material) was 11. The standard deviation of the particle diameter distribution was 2.3 μm (46% of the number average particle diameter). When the substantially non-porous microparticles were observed under a scanning electron microscope, more than 90% of the particles had a sphericity of 0.9 or more.

When a relief pattern was engraved on the obtained printing element, a large amount of viscous liquid debris was generated and the frequency of wiping needed to remove the debris became more than 10 times. Although the shape of the portions of the relief pattern which correspond to the halftone dots was a cone, the tack on the relief printing plate after wiping was as high as 280 N/m. Further, the abrasion loss measured by Taber abrasion testing was 75 mg.

TABLE 1

| | Resin (a) | | Organic compound (b)*2 | | Inorganic porous material (c) | | Polymerization initiator*3 | | Other additives*4 | |
|---|---|---|---|---|---|---|---|---|---|---|
| | Type | Amount*1 | Type | Amount*1 | Type | Amount*1 | Type | Amount*1 | Type | Amount*1 |
| Ex. 1 | SBS | 100 | BZMA<br>CHMA<br>BDEGMA | 25<br>19<br>6 | C-1504 | 5 | DMPAP | 0.6 | BHT | 0.5 |
| Comp. Ex. 1 | SBS | 100 | BZMA<br>CHMA<br>BDEGMA | 25<br>19<br>6 | None | | " | | " | |
| Ex. 2 | SBS | 100 | BZMA<br>CHMA<br>BDEGMA | 25<br>19<br>6 | C-450 | 5 | " | | " | |
| Ex. 3 | SBS | 100 | LMA<br>PPMA<br>DEEHEA<br>TEGDMA<br>TMPTMA | 6<br>15<br>25<br>2<br>2 | C-1504 | 5 | " | | " | |
| Ex. 4 | SBS | 100 | BZMA<br>CHMA<br>BDEGMA | 5<br>19<br>6 | C-1504 | 5 | " | | BHT<br>LB | 0.5<br>5 |

TABLE 1-continued

| | Resin (a) | | Organic compound (b)*2 | | Inorganic porous material (c) | | Polymerization initiator*3 | | Other additives*4 | |
|---|---|---|---|---|---|---|---|---|---|---|
| | Type | Amount*1 | Type | Amount*1 | Type | Amount*1 | Type | Amount*1 | Type | Amount*1 |
| Comp. Ex. 2 | SBS | 100 | BZMA<br>CHMA<br>BDEGMA | 5<br>19<br>6 | HiSil928 | 5 | " | | BHT<br>LB | 0.5<br>5 |

*1Amounts of the components of the resin composition are indicated in terms of parts by weight, relative to 100 parts be weight of resin (a).
*2Among organic compounds (b) used in the Examples and the Comparative Examples, BZMA, CHMA and PEMA are compounds having at least one functional group selected from the group consisting of an alicyclic functional group and an aromatic functional group.
*3DMPAP represents 2,2-dimethoxy-2-phenylacetophenone.
*4BHT represents 2,6-di-t-butylacetophenone and LB represents n-butyl laurate.

TABLE 2

| Abbreviations used in Table 1 | Nomenclature | Number average molecular weight*1 | Number of polymerizable unsaturated group per molecule*2 |
|---|---|---|---|
| LMA | lauryl methacrylate | 254 | 1 |
| PPMA | polypropylene glycol monomethacrylate | 400 | 1 |
| DEEHEA | diethylene glycol-2-ethylhexylmethyl acrylate | 286 | 1 |
| TEGDMA | tetraethylene glycol dimethacrylate | 330 | 2 |
| TMPTMA | trimethylol propane trimethacrylate | 339 | 3 |
| BZMA | benzyl methacrylate | 176 | 1 |
| CHMA | cyclohexyl methacrylate | 167 | 1 |
| BDEGMA | butoxy diethylene glycol methacrylate | 230 | 1 |
| PEMA | phenoxyethyl methacrylate | 206 | 1 |

*1When organic compound (b) was analyzed by GPC, the chromatogram showed a single peak having a polydispersibility of less than 1.1. Accordingly, the number average molecular weight was determined by mass spectrometric analysis.
*2Value obtained by NMR.

TABLE 3

| | Relative amount of residual debris (% by weight) | Frequency of wiping needed to remove the debris (BEMCOT impregnated with ethanol) | Tack on the relief printing plate after wiping (N/m) | Shape of relief portions corresponding to halftone dots |
|---|---|---|---|---|
| Ex. 1 | 8.0 | ≦3 | 55 | Excellent cone shape |
| Comp. Ex. 1 | 12.5 | 30< | 180 | Partially destructed and slightly unclear halftone dots |
| Ex. 2 | 7.0 | ≦3 | 85 | Excellent cone shape |
| Ex. 3 | 9.5 | ≦3 | 88 | Excellent cone shape |
| Ex. 4 | 8.0 | ≦3 | 110 | Excellent cone shape |
| Comp. Ex. 2 | 14.0 | 8 | 160 | Excellent cone shape, but some particles are exposed |

TABLE 4

| | Amount of Abrasion (mg) |
|---|---|
| Example 1 | 72 |
| Example 2 | 92 |
| Example 4 | 65 |
| Comparative Example 2 | 160 |

INDUSTRIAL APPLICABILITY

By the use of the photosensitive resin composition of the present invention for producing a printing element, it becomes possible to obtain a printing element which can suppress the generation of debris during the laser engraving thereof, thereby rendering easy the removal of debris. Further, the obtained printing element is advantageous in that a precise image can be formed on the printing element by laser engraving, and that the resultant image-bearing printing plate not only has small surface tack and excellent abrasion resistance, but also is capable of suppressing the attachment of paper dust and occurrence of printing defects. Such a laser engraved printing plate can be advantageously used not only for forming a relief pattern of a printing plate, but also for the production of a stamp and seal; a design roll for embossing; a relief pattern (used in the production of an electronic part, an optical part or a part relating to a display) for forming a pattern using a paste or ink of an insulating material, a resistive material, a conductive material or a semiconductive material (including an organic semiconductive material); a relief pattern for a mold used for producing potteries; a relief pattern for an advertisement or display board; and molds for various molded articles.

The invention claimed is:

1. A laser engravable printing element which is a photocured resin composition comprising:

(a) 100 parts by weight of a resin which is in a solid state at 20° C., wherein said resin has a number average molecular weight of from 5,000 to 300,000, (b) 5 to 200 parts by weight, relative to 100 parts by weight of said resin (a), of an organic compound having a number average molecular weight of less than 5,000 and having at least one polymerizable unsaturated group per molecule, and (c) 1 to 100 parts by weight, relative to 100 parts by weight of said resin (a), of inorganic porous particles having an average pore diameter of from 1 nm to 1,000 nm, a pore volume of from 0.1 ml/g to 10 ml/g and a number average particle diameter of not more than 10 μm, said laser engravable printing element being obtained by shaping said resin composition into a sheet or cylinder, and irradiating the shaped resin composition with a light or an electron beam to thereby photocure said resin composition.

2. The laser engravable printing element according to claim 1, wherein said inorganic porous material (c) has a specific surface area of from 10 $m^2/g$ to 1,500 $m^2/g$ and an oil absorption value of from 10 ml/100 g to 2,000 ml/100 g.

3. The laser engravable printing element according to claim 1 or 2, wherein at least 30% by weight of said resin (a) is at least one resin selected from the group consisting of a thermoplastic resin having a softening temperature of 500° C. or less and a solvent-soluble resin.

4. The laser engravable printing element according to claim 1 or 2, wherein at least 20% by weight of said organic compound (b) is a compound having at least one functional group selected from the group consisting of an alicyclic functional group and an aromatic functional group.

5. The laser engravable printing element according to claim 1 or 2, wherein said inorganic porous particles (c) are spherical particle or a regular polyhedral particle.

6. The laser engravable printing element according to claim 5, wherein at least 70% of said inorganic porous particles (c) are spherical particles each having a sphericity of from 0.5 to 1.

7. The laser engravable printing element according to claim 5, wherein said inorganic porous particles (c) are regular polyhedral particles each having a $D_3/D_4$ value of from 1 to 3, wherein $D_3$ represents the diameter of a smallest sphere which encloses said regular polyhedral particle therein and $D_4$ represents the diameter of a largest sphere which is enclosed in said regular polyhedral particle.

8. The laser engravable printing element according to claim 1 or 2, which is for use in forming a relief printing element.

9. A multi-layered, laser engravable printing element comprising a printing element layer and at least one elastomer layer provided below the printing element layer, wherein said printing element layer is made of the laser engravable printing element of claim 1 and said elastomer layer has a Shore A hardness of from 20 to 70.

10. The multi-layered, laser engravable printing element according to claim 9, wherein said elastomer layer is formed by photocuring a resin which is in a liquid state at 20° C.

11. A method for producing a laser engraved printing element, which comprises:

(i) forming a photocurable resin composition layer on a support, wherein said photocurable resin composition layer is obtained by shaping a resin composition comprising the following components (a), (b) and (c) into a sheet or cylinder, (a) 100 parts by weight of a resin which is in a solid state at 20° C., wherein said resin has a number average molecular weight of from 5,000 to 300,000, (b) 5 to 200 parts by weight, relative to 100 parts by weight of said resin (a), of an organic compound having a number average molecular weight of less than 5,000 and having at least one polymerizable unsaturated group per molecule, and (c) 1 to 100 parts by weight, relative to 100 parts by weight of said resin (a), of inorganic porous particles having an average pore diameter of from 1 nm to 1,000 nm, a pore volume of from 0.1 ml/g to 10 ml/g and a number average particle diameter of not more than 10 μm, (ii) crosslink-curing said photocurable resin composition layer by light or electron bean irradiation, thereby obtaining a cured resin composition layer, and (iii) irradiating a portion of said cured resin composition layer which is preselected in accordance with a desired relief pattern, with a laser beam to ablate and remove the irradiated portion of said cured resin composition layer, thereby forming a relief pattern on said cured resin composition layer.

12. The method according to claim 11, wherein said irradiation of the portion of the cured resin composition layer with a laser beam is performed while heating said portion.

13. The laser engravable printing element of claim 1 wherein said resin composition further comprises a photopolymerization initiator.

14. A laser engravable printing element which is a photocured resin composition comprising:

(a) 100 parts by weight of a styrene-butadiene copolymer resin which is in a solid state at 20° C., wherein said resin has a number average molecular weight of from 10,000 to 100,000, (b) 20 to 100 parts by weight, relative to 100 parts by weight of said resin (a), of at least one methacrylate organic compound having a number average molecular weight of less than 5,000 and having at least one polymerizable unsaturated group per molecule, and (c) 2 to 20 parts by weight, relative to 100 parts by weight of said resin (a), of silica inorganic porous particles having an average pore diameter of from 2 nm to 30 nm, a pore volume of from 0.1 ml/g to 10 ml/g and a number average particle diameter of not more than 10 μm, said laser engravable printing element being obtained by shaping said resin composition into a sheet or cylinder, and irradiating the shaped resin composition with a light or an electron beam to thereby photocure said resin composition, wherein said inorganic porous material (c) has a specific surface area of from 10 $m^2/g$ to 1,500 $m^2/g$ and an oil absorption value of from 10 ml/100 g to 2,000 ml/100 g, and said inorganic porous particles (c) are spherical particle or a regular polyhedral particle.

* * * * *